US012609156B2

(12) United States Patent
Chung

(10) Patent No.: US 12,609,156 B2
(45) Date of Patent: Apr. 21, 2026

(54) MEMORY DEVICE AND METHOD FOR CALIBRATING IMPEDANCE OF INPUT-OUTPUT CIRCUIT THEREOF

(71) Applicant: Samsung Electronics Co., Ltd., Suwon-si (KR)

(72) Inventor: Hae Young Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 203 days.

(21) Appl. No.: 18/461,550

(22) Filed: Sep. 6, 2023

(65) Prior Publication Data

US 2024/0290378 A1 Aug. 29, 2024

(30) Foreign Application Priority Data

Feb. 28, 2023 (KR) ........................ 10-2023-0026656

(51) Int. Cl.
*G11C 11/4096* (2006.01)
*G11C 11/4093* (2006.01)

(52) U.S. Cl.
CPC ...... *G11C 11/4096* (2013.01); *G11C 11/4093* (2013.01); *G11C 2207/2245* (2013.01)

(58) Field of Classification Search
CPC ........................ G11C 11/4096; G11C 11/4093
USPC ................................................... 365/189.011
See application file for complete search history.

(56) References Cited

U.S. PATENT DOCUMENTS

| | | | |
|---|---|---|---|
| 9,767,921 | B1 | 9/2017 | Pan |
| 9,825,631 | B1 * | 11/2017 | Cho ..................... G11C 29/021 |
| 2008/0054936 | A1 | 3/2008 | Fujisawa |
| 2009/0289659 | A1 | 11/2009 | Kuwahara et al. |
| 2017/0331476 | A1 | 11/2017 | Cho et al. |
| 2019/0036740 | A1 | 1/2019 | Wieduwilt et al. |
| 2020/0105316 | A1 | 4/2020 | Sridharan et al. |
| 2022/0254389 | A1 | 8/2022 | Hong |

* cited by examiner

*Primary Examiner* — Anthan Tran
(74) *Attorney, Agent, or Firm* — Wolf, Greenfield & Sacks, P.C.

(57) ABSTRACT

Disclosed is a memory device, which comprises a memory cell array that includes a plurality of memory cells; an input/output circuit configured to transmit data received from an outside (e.g., an external source) through a data pad to the memory cell array or transmit data read from the memory cell array to the external source; and an impedance calibration circuit configured to generate an impedance calibration code that is applied to the input/output circuit. The impedance calibration circuit is further configured to divide a total impedance calibration section into a plurality of sub-impedance calibration sections, and perform at least one sub-impedance calibration in each of the plurality of sub-impedance calibration sections, the at least one sub-impedance calibration corresponding to at least one of a plurality of impedance modes.

20 Claims, 16 Drawing Sheets

MEMORY DEVICE AND METHOD FOR CALIBRATING IMPEDANCE OF INPUT-OUTPUT CIRCUIT THEREOF

CROSS-REFERENCE TO RELATED APPLICATION(S)

This application claims priority under 35 U.S.C. § 119 to Korean Patent Application No. 10-2023-0026656 filed on Feb. 28, 2023, in the Korean Intellectual Property Office, the disclosure of which is incorporated by reference herein in its entirety.

BACKGROUND

Embodiments of the present disclosure described herein relate to a memory device, and more particularly, relate to a memory device and a method for calibrating an impedance of an input-output circuit thereof.

Semiconductor memory devices can be classified into volatile memory devices and nonvolatile memory devices. Volatile memory devices, for example, a dynamic random access memory (DRAM) device and a static random access memory (SRAM) device, have high reading and writing speeds, but lose their stored data when their power supplies are interrupted. Meanwhile, nonvolatile memory devices can retain their stored data even when their power supplies are interrupted.

Semiconductor memory devices may exchange data with an external device (for example, a memory controller) through an input-output circuit. As an operating speed of a semiconductor memory device increases, a swing width of a signal transmitted and received between the semiconductor memory device and a memory controller, and distortion of the signal due to impedance mismatch can become more problematic.

SUMMARY

Embodiments of the present disclosure provide a memory device preventing a change in termination impedance due to a change in impedance mode by generating various impedance calibration codes for each impedance mode.

Embodiments of the present disclosure provide a memory device generating various impedance calibration codes through a plurality of sub-impedance calibration operations within an entire impedance calibration section.

According to some embodiments, a memory device includes: a memory cell array that includes a plurality of memory cells; an input/output circuit configured to transmit data received from an outside (e.g., an external source) through a data pad to the memory cell array or transmit data read from the memory cell array to the external source; and an impedance calibration circuit configured to generate an impedance calibration code that is applied to the input/output circuit. The impedance calibration circuit is further configured to divide a total impedance calibration section into a plurality of sub-impedance calibration sections, and perform at least one sub-impedance calibration in each of the plurality of sub-impedance calibration sections, the at least one sub-impedance calibration corresponding to at least one of a plurality of impedance modes.

According to some embodiments, a memory device includes: a memory cell array that includes a plurality of memory cells; an input/output circuit configured to transmit data received from an outside (e.g., an external source) through a data pad to the memory cell array or transmit data read from the memory cell array to the external source; and an impedance calibration circuit configured to generate an impedance calibration code that is applied to the input/output circuit. The impedance calibration circuit is further configured to perform a first sub-impedance calibration corresponding to a read impedance mode that is applied during a read operation, perform a second sub-impedance calibration corresponding to a non-target impedance mode that is applied during a non-target read operation or a write operation, and perform a third sub-impedance calibration corresponding to a command impedance mode that is applied when a command is received between a start command and a latch command.

According to some embodiments, a method of calibrating an impedance of a memory device includes: receiving a start command among impedance calibration commands from a memory controller; performing a first sub-impedance calibration corresponding to a first impedance mode; performing a second sub-impedance calibration corresponding to a second impedance mode; performing a third sub-impedance calibration corresponding to the first impedance mode; and receiving a latch command among the impedance calibration commands from the memory controller.

BRIEF DESCRIPTION OF THE DRAWINGS

The above and other objects and features of the present disclosure will become apparent by describing in detail embodiments thereof with reference to the accompanying drawings.

FIG. 2 is a block diagram illustrating a memory device of FIG. 1.

DETAILED DESCRIPTION

Below, example embodiments of the present disclosure will be described in detail with reference to the accompanying drawings, in which example embodiments are shown.

Below, a dynamic random access memory (DRAM) device will be used as an example for illustrating features and functions of the present disclosure. However, other features and performances may be easily understood from information disclosed herein by a person of ordinary skill in the art. The present disclosure may be implemented by other embodiments or applied thereto. Further, the detailed description may be modified or changed according to viewpoints and applications without escaping from the scope of the present disclosure. As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof.

In order to mitigate or avoid a distortion problem due to impedance mismatch of a signal transmitted and received between a memory device and a memory controller, impedance calibration may be performed by adjusting output and/or termination impedance of the memory device to be constant using an external resistor so as to be independent of, for example, process, voltage and temperature (PVT) fluctuations.

Figure 1:
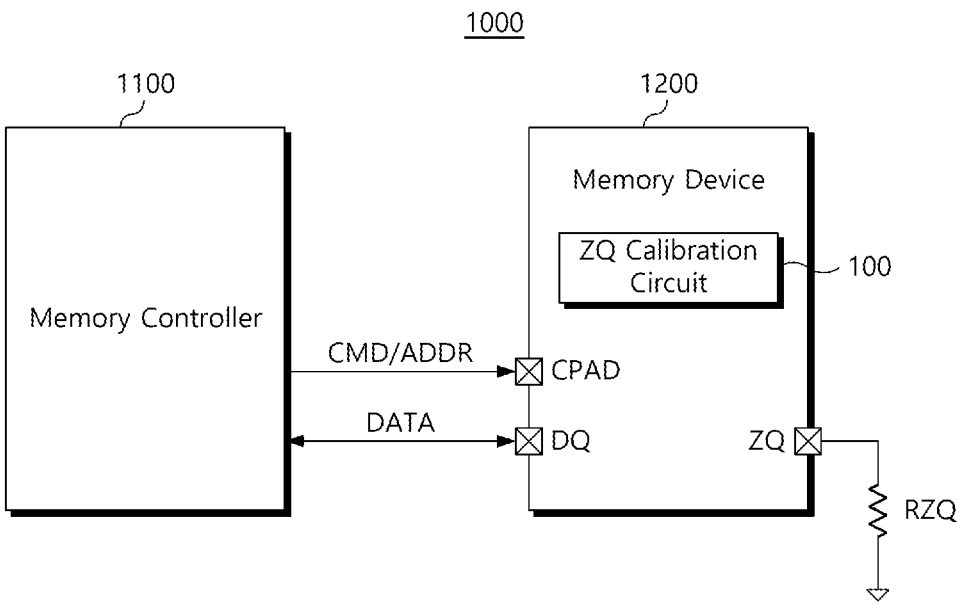
FIG. 1 is a block diagram illustrating a memory system according to some example embodiments.

FIG. 1 is a block diagram illustrating a memory system according to some example embodiments. Referring to FIG. 1, a memory system 1000 may include a memory controller 1100 and a memory device 1200.

According to an example embodiment, the memory controller 1100 may perform an access operation to write data in the memory device 1200 or to read data stored in the memory device 1200. For example, the memory controller 1100 may generate a command CMD and an address ADDR for writing data in the memory device 1200 or reading data stored in the memory device 1200. The memory controller 1100 may include at least one of a memory controller controlling the memory device 1200, a system-on-chip (SoC) such as an application processor (AP), a central processing unit (CPU), a digital signal processor (DSP), or a graphics processing unit (GPU).

According to an example embodiment, the memory controller 1100 may provide various signals to the memory device 1200 to control an overall operation of the memory device 1200. For example, the memory controller 1100 may control memory access operations of the memory device 1200 such as a read operation and a write operation. The memory controller 1100 may provide the command CMD and the address ADDR to the memory device 1200 to write data DATA in the memory device 1200 or to read data DATA from the memory device 1200.

According to an example embodiment, the memory controller 1100 may generate various types of commands CMD to control the memory device 1200. For example, the memory controller 1100 may generate a bank request corresponding to a bank operation of changing a state of a memory bank, among memory banks, to read or write data DATA. As an example, the bank request may include an active request for changing a state of a memory bank, among the memory banks, to an active state. The memory device 1200 may activate a row included in the memory bank, for example, a wordline, in response to the active request. The bank request may include a precharge request for changing the memory banks from an active state to a standby state after reading or writing of data DATA is completed. In addition, the memory controller 1100 may generate an input/output (I/O) request (for example, a column address strobe (CAS) request) for the memory device 1200 to perform a read operation or a write operation of data DATA. As an example, the I/O request may include a read request for reading data DATA from activated memory banks. The I/O request may include a write request for writing data DATA in the activated memory banks. The memory controller 1100 may generate a refresh command to control a refresh operation on the memory banks. However, the types of commands CMD described herein are merely exemplary, and other types of commands CMD may be present.

According to an example embodiment, the memory device 1200 may output data DATA, requested to be read by the memory controller 1100, to the memory controller 1100 or may store data DATA, requested to be written by the memory controller 1100, in a memory cell of the memory device 1200. The memory device 1200 may input and output data DATA based on the command CMD and the address ADDR. The memory device 1200 may include memory banks. The memory device 1200 may include at least one of a data pad DQ. The memory device 1200 may input and output data DATA through the data pad DQ. The data pad DQ may be connected to an input/output (I/O) circuit. Furthermore, the memory device 1200 may receive a command CMD and an address ADDR through a command pad CPAD.

The memory device 1200 may be a volatile memory device such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), and a static random access memory (SRAM), or the like. Alternatively, the memory device 1200 may be implemented as a nonvolatile memory device such as a resistive RAM (RRAM), a phase change memory (PRAM), a magnetoresistive memory (MRAM), a ferroelectric memory (FRAM), a spin-transfer torque RAM (STT-RAM), or the like. In the present specification, the advantages of the present disclosure have been described with respect to a DRAM, but example embodiments are not limited thereto.

According to an example embodiment, the memory banks may include a memory cell array divided in units of banks, a row decoder, a column decoder, a sense amplifier, a write driver, or the like. The memory banks may store data DATA, requested to be written in the memory device 1200, through the write driver and may read data DATA, requested to be read, using the sense amplifier. The memory banks may further include a component for a refresh operation of storing and maintaining data in the cell array, or select circuits based on an address.

According to an example embodiment, the memory device 1200 may include an impedance calibration circuit (or ZQ calibration circuit) 100. For example, impedance of the data pad DQ or the command pad CPAD may change according to an operating state (for example, a read operation, a write operation, or the like) of the memory device 1200. The impedance calibration circuit 100 may generate a plurality of impedance calibration codes corresponding to various impedance modes of the I/O circuit through the ZQ pad ZQ. The memory device 1200 may apply the plurality of impedance calibration codes to the I/O circuit based on a changed impedance mode. Furthermore, the impedance calibration circuit 100 may generate the plurality of impedance calibration codes corresponding to various impedance modes by performing a plurality of impedance calibrations within a specified impedance calibration time. An external resistor RZQ, which is a reference for the impedance calibrations, may be connected between the ZQ pad ZQ and a ground.

Figure 2:
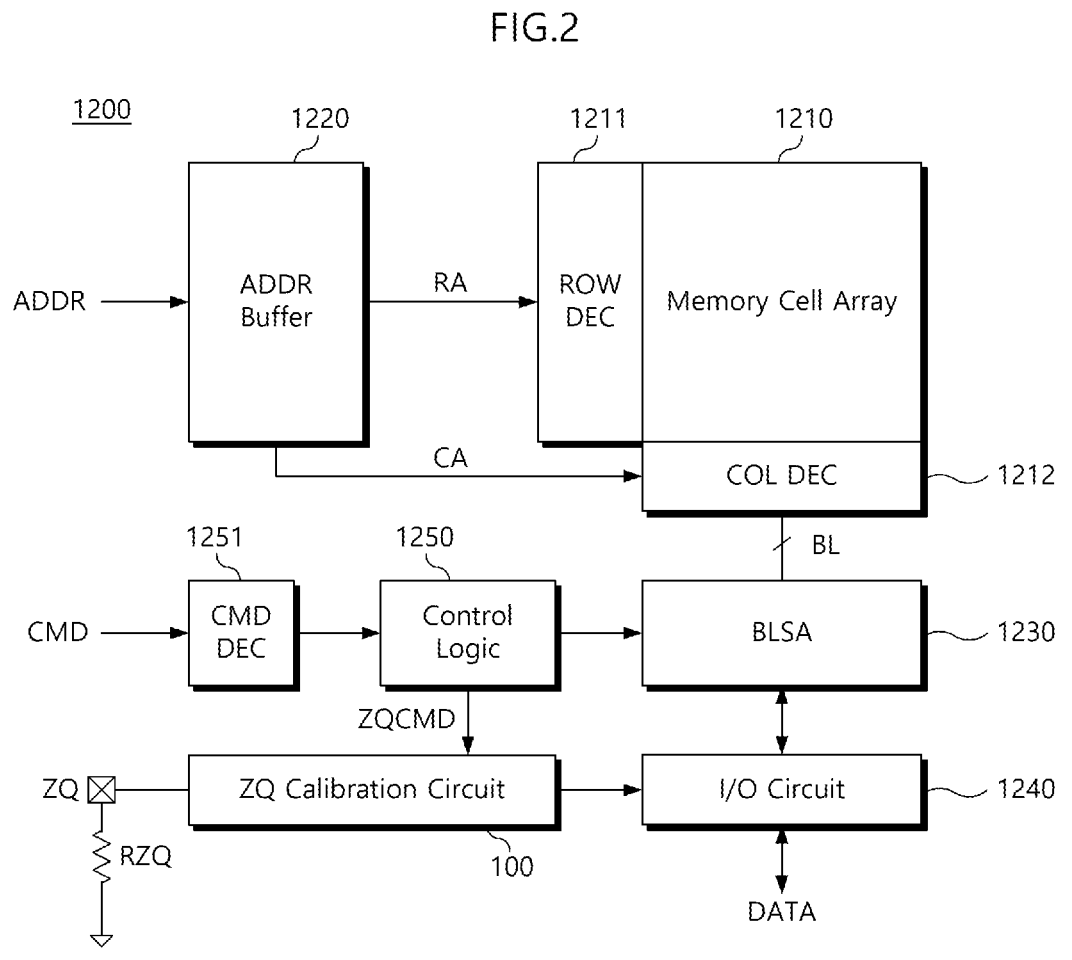

FIG. 2 is a block diagram illustrating a memory device of FIG. 1. Referring to FIG. 2, the memory device 1200 may include a memory cell array 1210, a row decoder 1211, a column decoder 1212, an address buffer 1220, a bitline sense amplifier 1230, an input/output circuit 1240, a command decoder 1251, control logic 1250, and an impedance calibration circuit 100.

According to an example embodiment, the memory cell array 1210 may include a plurality of memory cells arranged in a matrix of rows and columns. For example, the memory cell array 1210 may include a plurality of wordlines and a plurality of bitlines BL connected to memory cells. The plurality of wordlines may be connected to rows of the memory cells, and the plurality of bitlines BL may be connected to columns of the memory cells.

According to an example embodiment, the address buffer 1220 may receive an address ADDR from the memory controller 1100 of FIG. 1. For example, the address ADDR may include a row address RA addressing a row of the memory cell array 1210 and a column address CA addressing a column of the memory cell array 1210. The address buffer 1220 may transmit the row address RA to the row decoder 1211 and may transmit the column address CA to the column decoder 1212.

According to an example embodiment, the row decoder 1211 may select one of the plurality of wordlines connected to the memory cell array 1210. The row decoder 1211 may decode the row address RA, received from the address buffer 1220, to select a single wordline corresponding to the row address RA and may activate the selected wordline.

According to an example embodiment, the column decoder 1212 may select a predetermined bitline from among the plurality of bitlines BL of the memory cell array 1210. The column decoder 1212 may decode the column address CA, received from the address buffer 1220, to select the predetermined bitline BL corresponding to the column address CA.

According to an example embodiment, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage.

According to an example embodiment, the input/output circuit 1240 may output data DATA to the memory controller 1100 through data lines based on a sensed and amplified voltage from the bitline sense amplifier 1230. For example, the input/output circuit 1240 may include an input buffer or an output buffer. The input buffer or the output buffer may be connected to the data pad DQ of FIG. 1. The input/output circuit 1240 may include an offset compensation circuit compensating for an input offset of the input buffer. For example, the input/output circuit 1240 may transmit data DATA received from an external source (e.g., the memory controller 1100 of FIG. 1) through the data pad DQ of FIG. 1 to the memory cell array 1210 or may transmit data DATA read from the memory cell array 1210 to the external source through the data pad DQ of FIG. 1. As used herein, the term "external source" is intended to broadly refer to a device, circuit, block and/or module that resides externally (i.e., outside of a functional or physical boundary) with respect to a given circuit, block, module, or device.

According to an example embodiment, the command decoder 1251 may decode a write enable signal/WE, a row address strobe signal/RAS, a column address strobe signal/CAS, and a chip select signal/CS received from the memory controller 1100 such that control signals corresponding to the command CMD are generated in the control logic 1250. The command CMD may include an active request, a read request, a write request, or a precharge request. The control logic 1250 may control an overall operation of the bitline sense amplifier 1230 through the control signals corresponding to the command CMD.

According to an example embodiment, the impedance calibration circuit (or ZQ calibration circuit) 100 may perform an impedance calibration to generate an impedance calibration code applied to the input/output circuit 1240. For example, the external resistor RZQ, which is a reference for the impedance calibration, may be connected between the ZQ pad ZQ and the ground. The impedance calibration circuit 100 may generate a plurality of impedance calibration codes corresponding to various impedance modes of the input/output circuit 1240 through the ZQ pad ZQ. Furthermore, the impedance calibration circuit 100 may generate and store the plurality of impedance calibration codes corresponding to the various impedance modes by performing a plurality of impedance calibrations within a specified impedance calibration time. The memory device 1200 may apply the plurality of impedance calibration codes to the input/output circuit 1240 based on a changed impedance mode.

Figure 3:
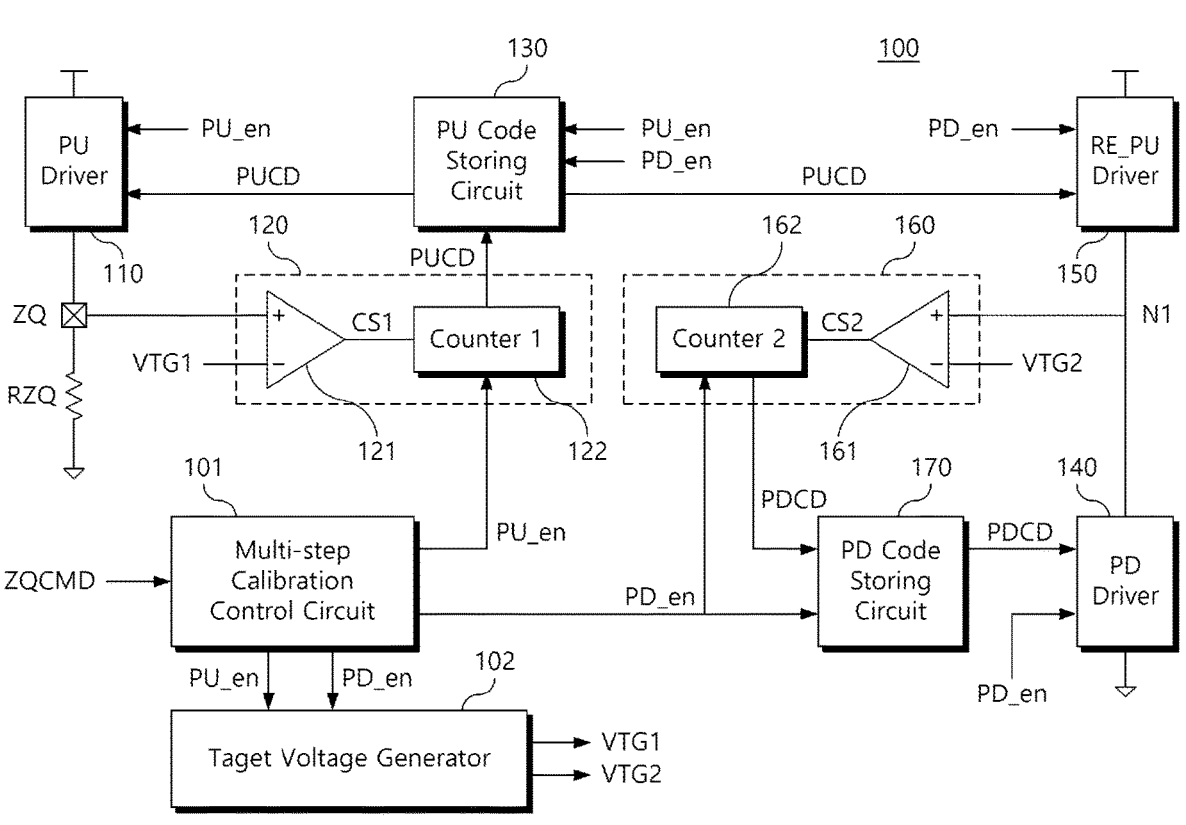
FIG. 3 is a block diagram illustrating an impedance calibration circuit of FIG. 2.

FIG. 3 is a block diagram illustrating an impedance calibration circuit of FIG. 2. Referring to FIG. 3, the impedance calibration circuit 100 may include a pull-up driver 110, a first code generator 120, a pull-up code storing circuit 130, a pull-down driver 140, a replica pull-up driver 150, a second code generator 160, a pull-down code storing circuit 170, a multi-step calibration control circuit 101 and/or a target voltage generator 102. The external resistor RZQ (for example, 240 ohms) may be connected between the ZQ pad ZQ and the ground.

According to an example embodiment, the pull-up driver 110 may be connected between a power voltage terminal and the ZQ pad ZQ. For example, the pull-up driver 110 may have substantially the same configuration as that of a pull-up driver included in the input/output circuit 1240 of FIG. 2. The pull-up driver 110 may be driven based on a pull-up impedance control signal PU_en and a pull-up impedance calibration code PUCD.

According to an example embodiment, the first code generator 120 may generate the pull-up impedance calibration code PUCD according to a result of comparing a voltage of the ZQ pad ZQ with a first target voltage VTG1 (e.g., a first reference voltage). For example, the first code generator 120 may include a first comparator 121 and a first counter 122. The first comparator 121 may compare the voltage of the ZQ pad ZQ with the first target voltage VTG1 and output a first comparison signal CS1. As an example, when the voltage of the ZQ pad ZQ is smaller than or equal to the first target voltage VTG1, the first comparison signal CS1 may have a low level. And when the voltage of the ZQ pad ZQ is greater than the first target voltage VTG1, the first comparison signal CS1 may have a high level. The first counter 122 may perform a counting operation based on the first comparison signal CS1 and may generate the pull-up impedance calibration code PUCD. As an example, the first counter 122 may increase or decrease the pull-up impedance calibration code PUCD until a logic level of the first comparison signal CS1 transitions. As used herein, "a transition of a signal" (or similar language) means a logic level of the signal transitions from a low level to a high level or vice versa. The first counter 122 may transfer a determined pull-up impedance calibration code PUCD to the pull-up code storing circuit 130.

According to an example embodiment, the pull-up code storing circuit 130 may store the pull-up impedance calibration code PUCD transferred from the first counter 122. For example, when a logic level of the first comparison signal CS1 transitions, the first counter 122 may transmit the pull-up impedance calibration code PUCD, and the pull-up code storing circuit 130 may store the pull-up impedance calibration code PUCD. The pull-up code storing circuit 130 may store a plurality of pull-up impedance calibration codes PUCDs corresponding to a plurality of impedance modes.

According to an example embodiment, the pull-up code storing circuit 130 may transmit the stored pull-up impedance calibration code PUCD to the pull-up driver 110 or the replica pull-up driver 150. For example, during an impedance calibration of the pull-up driver 110, the pull-up code storing circuit 130 may transmit the pull-up impedance calibration code PUCD to the pull-up driver 110 according to the pull-up impedance control signal PU_en. During an impedance calibration of the pull-down driver 140, the pull-up code storing circuit 130 may transmit the pull-up impedance calibration code PUCD to the replica pull-up driver 150 according to the pull-down impedance control signal PD_en.

According to an example embodiment, the pull-down driver 140 may be connected between the ground and a first node N1. For example, the pull-down driver 140 may have substantially the same configuration as a pull-down driver included in the input/output circuit 1240 of FIG. 2. The pull-down driver 140 may be driven based on the pull-down impedance control signal PD_en and a pull-down impedance calibration code PDCD.

According to an example embodiment, the replica pull-up driver 150 may be connected between the power voltage terminal and the first node N1. For example, the replica pull-up driver 150 may have substantially the same configuration as the pull-up driver 110. The replica pull-up driver 150 may be driven based on the pull-down impedance control signal PD_en and the pull-up impedance calibration code PUCD. The replica pull-up driver 150 may have substantially the same configuration as the pull-up driver 110 in order to perform an impedance calibration of the pull-down driver 140.

According to an example embodiment, the second code generator 160 may generate the pull-down impedance calibration code PDCD according to a result of comparing a voltage of the first node N1 and a second target voltage VTG2 (e.g., a second reference voltage). For example, the second code generator 160 may include a second comparator 161 and a second counter 162. The second comparator 161 may compare the voltage of the first node N1 with the second target voltage VTG2 and output a second comparison signal CS2. As an example, when the voltage of the first node N1 is smaller than or equal to the second target voltage VTG2, the second comparison signal CS2 may have a low level. And when the voltage of the first node N1 is greater than the second target voltage VTG2, the second comparison signal CS2 may have a high level. The second counter 162 may perform a counting operation based on the second comparison signal CS2 and may generate the pull-down impedance calibration code PDCD. As an example, the second counter 162 may increase or decrease the pull-down impedance calibration code PDCD until a logic level of the second comparison signal CS2 transitions. The second counter 162 may transfer a determined pull-down impedance calibration code PDCD to the pull-down code storing circuit 170.

According to an example embodiment, the pull-down code storing circuit 170 may transmit the stored pull-down impedance calibration code PDCD to the pull-down driver 140. For example, during an impedance calibration of the pull-down driver 140, the pull-down code storing circuit 170 may transmit the pull-down impedance calibration code PDCD to the pull-down driver 140 according to the pull-down impedance control signal PD_en.

According to an example embodiment, the multi-step calibration control circuit 101 may control the impedance calibration circuit 100 to perform a plurality of sub-impedance calibrations within a total impedance calibration section based on an impedance calibration command ZQCMD. For example, the multi-step calibration control circuit 101 may receive the impedance calibration command ZQCMD from the control logic 1250 of FIG. 2. The impedance calibration command ZQCMD may be generated by the memory controller 1100 of FIG. 1. The total impedance calibration section may be determined based on the impedance calibration command ZQCMD. The multi-step calibration control circuit 101 may generate the pull-up impedance control signal PU_en or the pull-down impedance control signal PD_en so that the plurality of sub-impedance calibrations are allocated within the total impedance calibration section.

According to an example embodiment, the target voltage generator 102 may generate a target voltage used in the first code generator 120 or the second code generator 160. For example, the target voltage generator 102 may generate the first target voltage VTG1 transmitted to the first code generator 120 based on the pull-up impedance control signal PU_en. The target voltage generator 102 may generate the second target voltage VTG2 transmitted to the second code generator 160 based on the pull-down impedance control signal PD_en. The first target voltage VTG1 and the second target voltage VTG2 may be determined according to the currently performed impedance calibration mode. During the impedance calibration, the first target voltage VTG1 or the second target voltage VTG2 may be determined based on a set impedance of the pull-up driver 110 or the pull-down driver 140. As an example, the first target voltage VTG1 and the second target voltage VTG2 may be set identically. As another example, the first target voltage VTG1 and the second target voltage VTG2 may be set to be different from each other.

Figure 4:
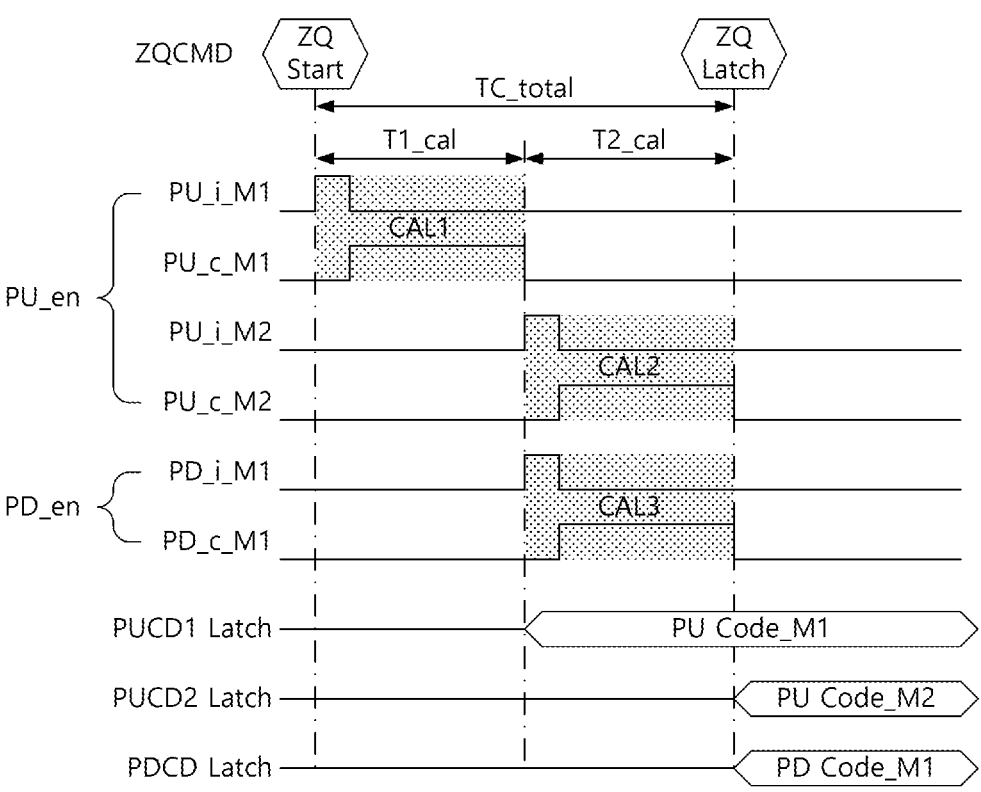
FIG. 4 is a timing diagram illustrating an example of a multi-step impedance calibration method of the impedance calibration circuit of FIG. 3.

FIG. 4 is a timing diagram illustrating an example of a multi-step impedance calibration method of the impedance calibration circuit of FIG. 3. Referring to FIGS. 3 and 4, the impedance calibration circuit 100 may perform a plurality of sub-impedance calibrations by dividing a total impedance calibration section TC_total into sub-calibration sections. In other words, the impedance calibration circuit 100 may divide the total impedance calibration section TC_total into a plurality of sub-impedance calibration sections (e.g., T1_cal and T2_cal). For example, the impedance calibration circuit 100 may receive the impedance calibration command ZQCMD. The impedance calibration command ZQCMD may include a start command ZQ Start and a latch command ZQ Latch. The impedance calibration circuit 100 may perform an impedance calibration between the start command ZQ Start and the latch command ZQ Latch. The total impedance calibration section TC_total may be set as a time between the start command ZQ Start and the latch command ZQ Latch.

According to an example embodiment, the multi-step calibration control circuit 101 may receive the start command ZQ Start and generate impedance control signals corresponding to sub-impedance calibrations. For example, in a first impedance calibration section T1_cal, the multi-step calibration control circuit 101 may generate a first impedance control signal corresponding to a first sub-impedance calibration CAL1. The first sub-impedance calibration CAL1 may correspond to a first impedance mode M1 (for example, a read operation). The first sub-impedance calibration CAL1 may be an impedance calibration for the pull-up driver 110 in the first impedance mode M1. In the second impedance calibration section T2_cal, the multi-step calibration control circuit 101 may generate a second impedance control signal corresponding to a second sub-impedance calibration CAL2. The second sub-impedance calibration CAL2 may correspond to a second impedance mode M2 (for example, a non-target read operation or a write operation). The second sub-impedance calibration CAL2 may be an impedance calibration for the pull-up driver 110 in the second impedance mode M2. In the second impedance calibration section T2_cal, the multi-step calibration control circuit 101 may generate a third impedance control signal corresponding to a third sub-impedance calibration CAL3. The third sub-impedance calibration CAL3 may correspond to the first impedance mode M1 (for example, a read operation). The third sub-impedance calibration CAL3 may be an impedance calibration for the pull-down driver 140 in the first impedance mode M1.

According to an example embodiment, the first sub-impedance calibration CAL1 may represent a pull-up impedance calibration corresponding to the first impedance mode M1 (for example, a read operation or a RON mode). For example, in the first impedance calibration section T1_cal, the multi-step calibration control circuit 101 may generate the first impedance control signal. The first impedance control signal may include a first pull-up initial signal PU_i_M1 and a first pull-up control signal PU_c_M1. Based on the first pull-up initial signal PU_i_M1, the pull-up code storing circuit 130 may transmit a previously stored first pull-up impedance calibration code PUCD1 to the pull-up driver 110. The pull-up driver 110 may be driven based on the first pull-up impedance calibration code PUCD1. After that, based on the first pull-up control signal PU_c_M1, the pull-up driver 110 and the first code generator 120 may perform the first sub-impedance calibration CAL1. When the first sub-impedance calibration CAL1 is completed, after the first impedance calibration section T1_cal, the first code generator 120 may store (or update) a new first pull-up impedance calibration code PUCD1 in the pull-up code storing circuit 130. The first pull-up impedance calibration code PUCD1 may correspond to the first impedance mode M1.

According to an example embodiment, the second sub-impedance calibration CAL2 may represent a pull-up impedance calibration corresponding to the second impedance mode M2 (for example, a non-target read operation, a write operation, or a RTT mode). For example, in the second impedance calibration section T2_cal, the multi-step calibration control circuit 101 may generate a second impedance control signal. The second impedance control signal may include a second pull-up initial signal PU_i_M2 and a second pull-up control signal PU_c_M2. Based on the second pull-up initial signal PU_i_M2, the pull-up code storing circuit 130 may transmit a previously stored second pull-up impedance calibration code PUCD2 to the pull-up driver 110. The pull-up driver 110 may be driven based on the second pull-up impedance calibration code PUCD2. After that, based on the second pull-up control signal PU_c_M2, the pull-up driver 110 and the first code generator 120 may perform a second sub-impedance calibration CAL2. When the second sub-impedance calibration CAL2 is completed, after the second impedance calibration section T2_cal, the first code generator 120 may store (or update) a new second pull-up impedance calibration code PUCD2 in the pull-up code storing circuit 130. The second pull-up impedance calibration code PUCD2 may correspond to the second impedance mode M2.

According to an example embodiment, the third sub-impedance calibration CAL3 may represent a pull-down impedance calibration corresponding to the first impedance mode M1 (for example, a read operation or a RON mode). For example, in the second impedance calibration section T2_cal, the multi-step calibration control circuit 101 may generate a third impedance control signal. The third impedance control signal may include a pull-down initial signal PD_i_M1 and a pull-down control signal PD_c_M1. Based on the pull-down initial signal PD_i_M1, the pull-down code storing circuit 170 may transmit a previously stored pull-down impedance calibration code PDCD to the pull-down driver 140. The pull-down driver 140 may be driven based on the pull-down impedance calibration code PDCD. In addition, based on the pull-down initial signal PD_i_M1, the pull-up code storing circuit 130 may transmit the updated first pull-up impedance calibration code PUCD1 in the first sub-impedance calibration CAL1 to the replica pull-up driver 150. The replica pull-up driver 150 may be driven based on the updated first pull-up impedance control code PUCD1. After that, based on the pull-down control signal PD_c_M1, the pull-down driver 140, the replica pull-up driver 150, and the second code generator 160 may perform a third sub-impedance calibration CAL3. When the third sub-impedance calibration CAL3 is completed, after the second impedance calibration section T2_cal, the second code generator 160 may store (or update) a new pull-down impedance calibration code PDCD in the pull-down code storing circuit 170. The pull-down impedance calibration code PDCD may correspond to the first impedance mode M1. As an example, the third sub-impedance calibration CAL3 may be performed simultaneously with the second sub-impedance calibration CAL2 (for example, in the second impedance calibration section T2_cal).

Accordingly, the impedance calibration circuit 100 may perform at least one of the first, second, or third sub-impedance calibrations CAL1, CAL2, or CAL3 in each of the first and second impedance calibration sections T1_cal and T2_cal. The first, second, and third sub-impedance calibrations CAL1, CAL2, and CAL3 may respectively correspond to at least one of the first or second impedance modes M1 or M2. For example, the first sub-impedance calibration CAL1 may correspond to the first impedance mode M1 (for example, a read operation), the second sub-impedance calibration CAL2 may correspond to the second impedance mode M2 (for example, a non-target read operation or a write operation), and the third sub-impedance calibration CAL3 may correspond to the first impedance mode M1 (for example, a read operation).

Figure 5:
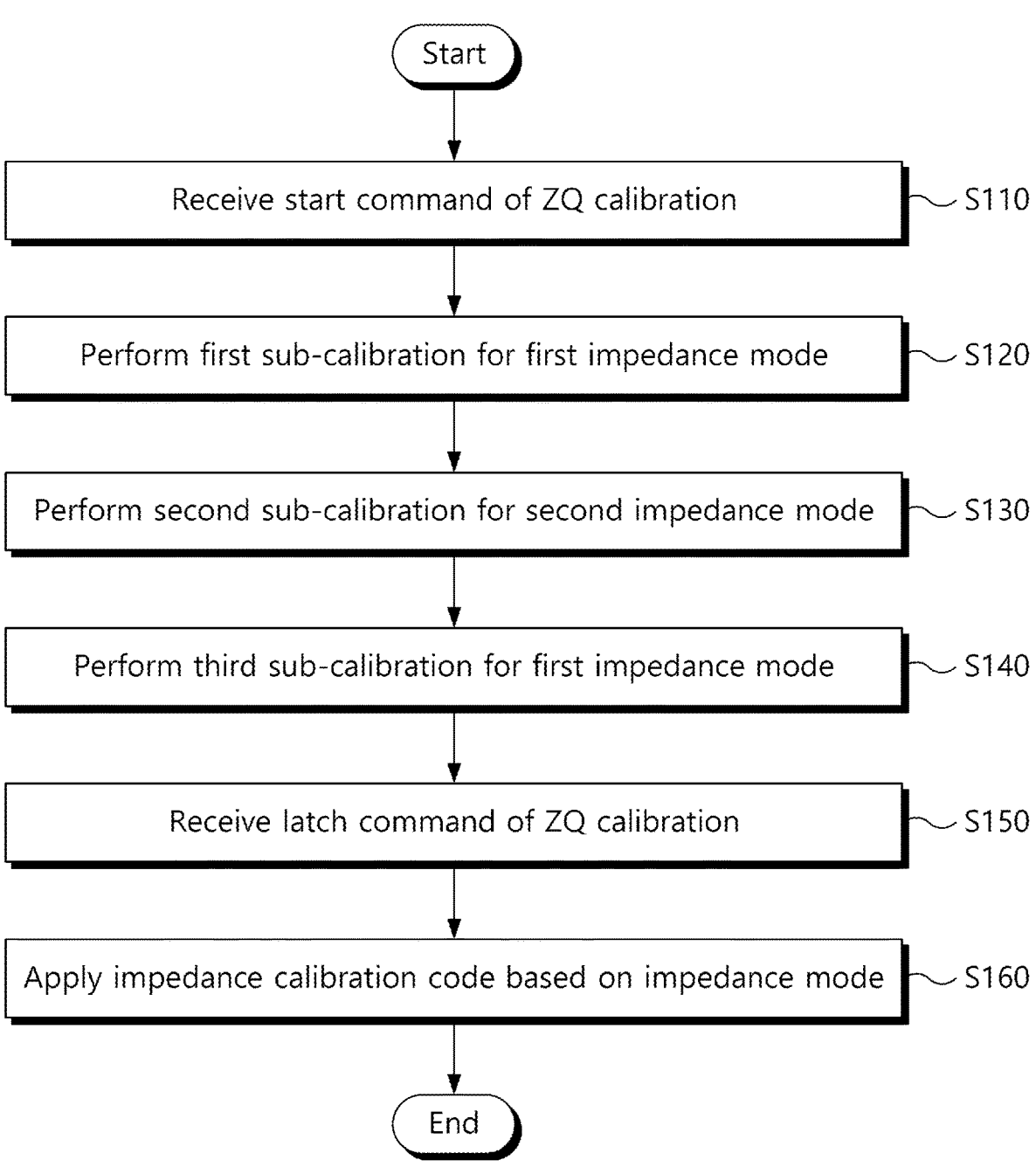
FIG. 5 is a flowchart illustrating an example of a multi-step impedance calibration method of the impedance calibration circuit of FIG. 3.

FIG. 5 is a flowchart illustrating an example of a multi-step impedance calibration method of the impedance calibration circuit of FIG. 3. Referring to FIGS. 3 to 5, the impedance calibration circuit 100 may perform the plurality of sub-impedance calibrations by dividing the total impedance calibration section TC_total into the sub-calibration sections.

According to an example embodiment, in operation S110, the impedance calibration circuit 100 may receive the start command ZQ Start among the impedance calibration commands ZQCMD. For example, the start command ZQ Start may be transmitted from the control logic 1250 of FIG. 2 (or the memory controller 1100 of FIG. 1). The total impedance calibration section TC_total may be started by the start command ZQ Start.

According to an example embodiment, in operation S120, the impedance calibration circuit 100 may perform the first sub-impedance calibration CAL1 corresponding to the first impedance mode M1 (for example, a read operation or a RON mode). During the first sub-impedance calibration CAL1, the impedance calibration circuit 100 may perform an impedance calibration of the pull-up driver 110 in the first impedance mode M1. For example, in the first impedance calibration section T1_cal, the multi-step calibration control circuit 101 may generate a first impedance control signal. The first impedance control signal may include the first pull-up initial signal PU_i_M1 and the first pull-up control signal PU_c_M1. Based on the first pull-up initial signal PU_i_M1, the pull-up code storing circuit 130 may transmit a previously stored first pull-up impedance calibration code PUCD1 to the pull-up driver 110. The pull-up driver 110 may be driven based on the first pull-up impedance calibration code PUCD1. After that, based on the first pull-up control signal PU_c_M1, the pull-up driver 110 and the first code generator 120 may perform the first sub-impedance calibration CAL1. When the first sub-impedance calibration CAL1 is completed, after the first impedance calibration section T1_cal, the first code generator 120 may store (or update) a new first pull-up impedance calibration code PUCD1 in the pull-up code storing circuit 130.

According to an example embodiment, in operation S130, the impedance calibration circuit 100 may perform the second sub-impedance calibration CAL2 corresponding to the second impedance mode M2 (for example, a non-target read operation, a write operation, or a RTT mode). During the second sub-impedance calibration CAL2, the impedance calibration circuit 100 may perform an impedance calibration of the pull-up driver 110 in the second impedance mode M2. For example, in the second impedance calibration section T2_cal, the multi-step calibration control circuit 101 may generate a second impedance control signal. The second impedance control signal may include the second pull-up initial signal PU_i_M2 and the second pull-up control signal PU_c_M2. Based on the second pull-up initial signal PU_i_M2, the pull-up code storing circuit 130 may transmit a previously stored second pull-up impedance calibration code PUCD2 to the pull-up driver 110. The pull-up driver 110 may be driven based on the second pull-up impedance calibration code PUCD2. After that, based on the second pull-up control signal PU_c_M2, the pull-up driver 110 and the first code generator 120 may perform a second sub-impedance calibration CAL2. When the second sub-impedance calibration CAL2 is completed, after the second impedance calibration section T2_cal, the first code generator 120 may store (or update) a new second pull-up impedance calibration code PUCD2 in the pull-up code storing circuit 130.

According to an example embodiment, in operation S140, the impedance calibration circuit 100 may perform the third sub-impedance calibration CAL3 corresponding to the first impedance mode M1 (for example, a read operation or a RON mode). During the third sub-impedance calibration CAL3, the impedance calibration circuit 100 may perform an impedance calibration of the pull-down driver 140 in the first impedance mode M1. For example, in the second impedance calibration section T2_cal, the multi-step calibration control circuit 101 may generate a third impedance control signal. The third impedance control signal may include the pull-down initial signal PD_i_M1 and a pull-down control signal PD_c_M1. Based on the pull-down initial signal PD_i_M1, the pull-down code storing circuit 170 may transmit a previously stored pull-down impedance calibration code PDCD to the pull-down driver 140. The pull-down driver 140 may be driven based on the pull-down impedance calibration code PDCD. In addition, based on the pull-down initial signal PD_i_M1, the pull-up code storing circuit 130 may transmit the updated first pull-up impedance calibration code PUCD1 in the first sub-impedance calibration CAL1 to the replica pull-up driver 150. The replica pull-up driver 150 may be driven based on the first pull-up impedance calibration code PUCD1. After that, based on the pull-down control signal PD_c_M1, the pull-down driver 140, the replica pull-up driver 150, and the second code generator 160 may perform the third sub-impedance calibration CAL3. When the third sub-impedance calibration CAL3 is completed, after the second impedance calibration section T2_cal, the second code generator 160 may store (or update) a new pull-down impedance calibration code PDCD in the pull-down code storing circuit 170. As an example, the third sub-impedance calibration CAL3 may be performed simultaneously with the second sub-impedance calibration CAL2 (for example, in the second impedance calibration section T2_cal).

According to an example embodiment, in operation S150, the impedance calibration circuit 100 may receive the latch command ZQ Latch among the impedance calibration commands ZQCMD. For example, the latch command ZQ Latch may be transmitted from the control logic 1250 of FIG. 2 (or the memory controller 1100 of FIG. 1). The total impedance calibration section TC_total may be terminated by the latch command ZQ Latch.

According to an example embodiment, in operation S160, the impedance calibration circuit 100 may apply an impedance calibration code to the input/output circuit 1240 of FIG. 2 based on an impedance mode. For example, the input/output circuit 1240 of FIG. 2 may include a data pull-up driver having substantially the same configuration as the pull-up driver 110. The input/output circuit 1240 of FIG. 2 may include a data pull-down driver having substantially the same configuration as the pull-down driver 140. The impedance calibration circuit 100 may provide an impedance calibration code corresponding to an operation mode (for example, a read operation, a write operation, or the like) of the memory device 1200 to the data pull-up driver or the data pull-down driver of the input/output circuit 1240.

Figure 6:
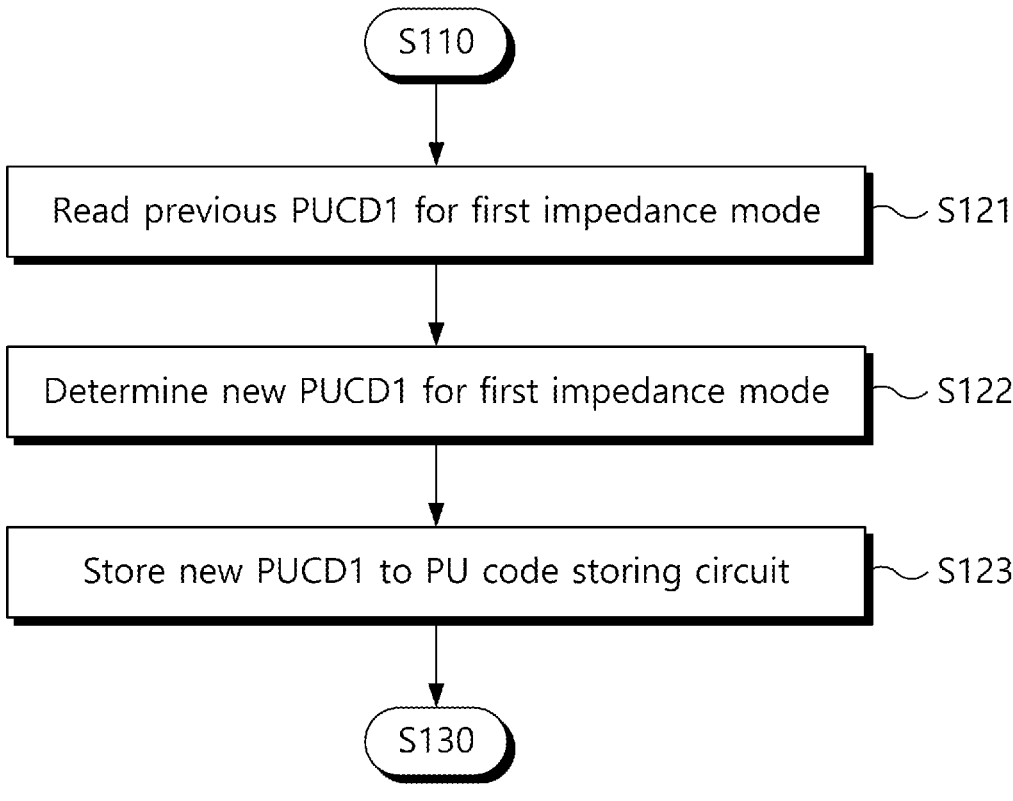
FIG. 6 is a flowchart illustrating a first sub-impedance calibration of FIG. 5.
Figure 7:
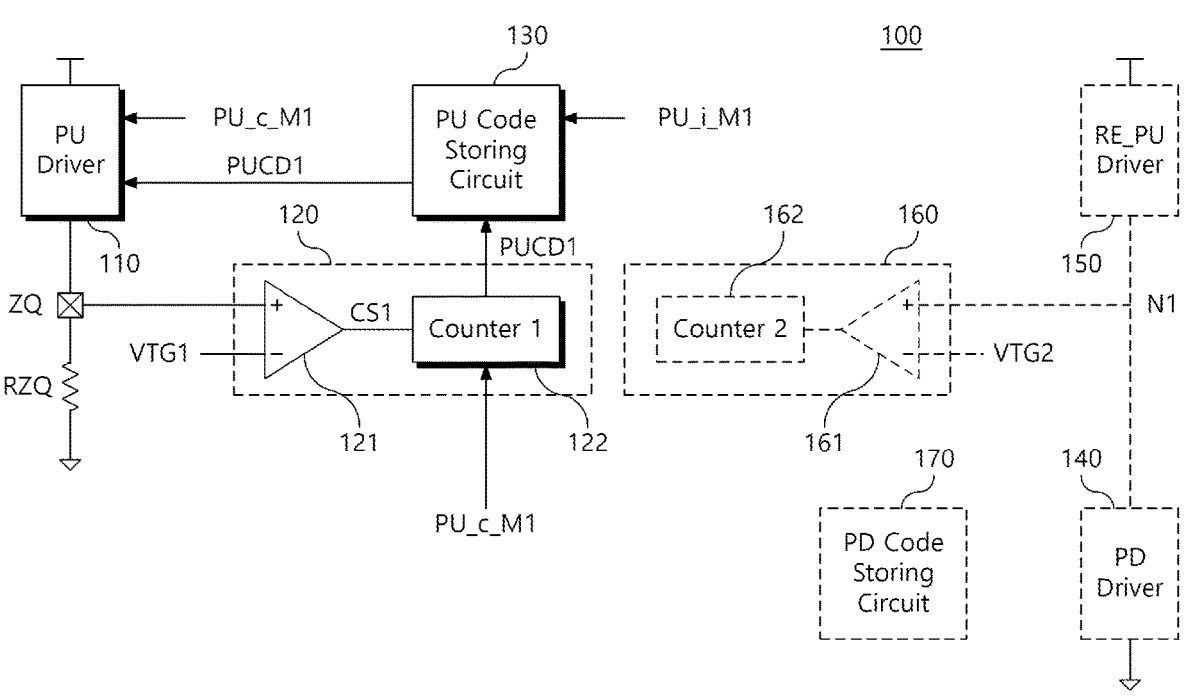
FIG. 7 is a diagram illustrating an impedance calibration circuit during the first sub-impedance calibration of FIG. 5.

FIG. 6 is a flowchart illustrating a first sub-impedance calibration of FIG. 5. FIG. 7 is a diagram illustrating an impedance calibration circuit during the first sub-impedance calibration of FIG. 5. Referring to FIGS. 6 and 7, during the first sub-impedance calibration CAL1, the impedance calibration circuit 100 may only partially operate. For example, the first sub-impedance calibration CAL1 may be performed through the pull-up driver 110, the first code generator 120 and the pull-up code storing circuit 130 (e.g., a first part of the impedance calibration circuit 100). During the first sub-impedance calibration CAL1, the pull-down driver 140, the replica pull-up driver 150, the second code generator 160, and the pull-down code storing circuit 170 may be deactivated. During the first sub-impedance calibration CAL1, the impedance calibration circuit 100 may newly acquire the first pull-up impedance calibration code PUCD1 of the pull-up driver 110 operating in the first impedance mode M1.

According to an example embodiment, in operation S121, the impedance calibration circuit 100 may read a previous first pull-up impedance calibration code PUCD1. For example, the pull-up code storing circuit 130 may receive the first pull-up initial signal PU_i_M1. The pull-up code storing circuit 130 may transmit the previously stored first pull-up impedance calibration code PUCD1 to the pull-up driver 110 based on the first pull-up initial signal PU_i_M1. The pull-up driver 110 may be driven based on the previous first pull-up impedance calibration code PUCD1.

According to an example embodiment, in operation S122, the impedance calibration circuit 100 may determine a new first pull-up impedance calibration code PUCD1. For example, the pull-up driver 110 and the first code generator 120 may receive the first pull-up control signal PU_c_M1. The pull-up driver 110 and the first code generator 120 may perform the first sub-impedance calibration CAL1 based on the first pull-up control signal PU_c_M1. As an example, the first sub-impedance calibration CAL1 may be performed until a transition of the first comparison signal CS1 occurs by comparing the voltage of the ZQ pad ZQ with the first target voltage VTG1. When the transition of the first comparison signal CS1 occurs due to the comparison between the voltage of the ZQ pad ZQ and the first target voltage VTG1, the first counter 122 may determine the new first pull-up impedance calibration code PUCD1. As another example, the first sub-impedance calibration CAL1 may be performed for a specified time. The first counter 122 may determine the new first pull-up impedance calibration code PUCD1 when the specified time elapses.

According to an example embodiment, in operation S123, the impedance calibration circuit 100 may store (or update) the new first pull-up impedance calibration code PUCD1. For example, when the new first pull-up impedance calibration code PUCD1 is determined, the first counter 122 may transmit the new first pull-up impedance calibration code PUCD1 to the pull-up code storing circuit 130. The pull-up code storing circuit 130 may store (or update) the new first pull-up impedance calibration code PUCD1.

Figure 8:
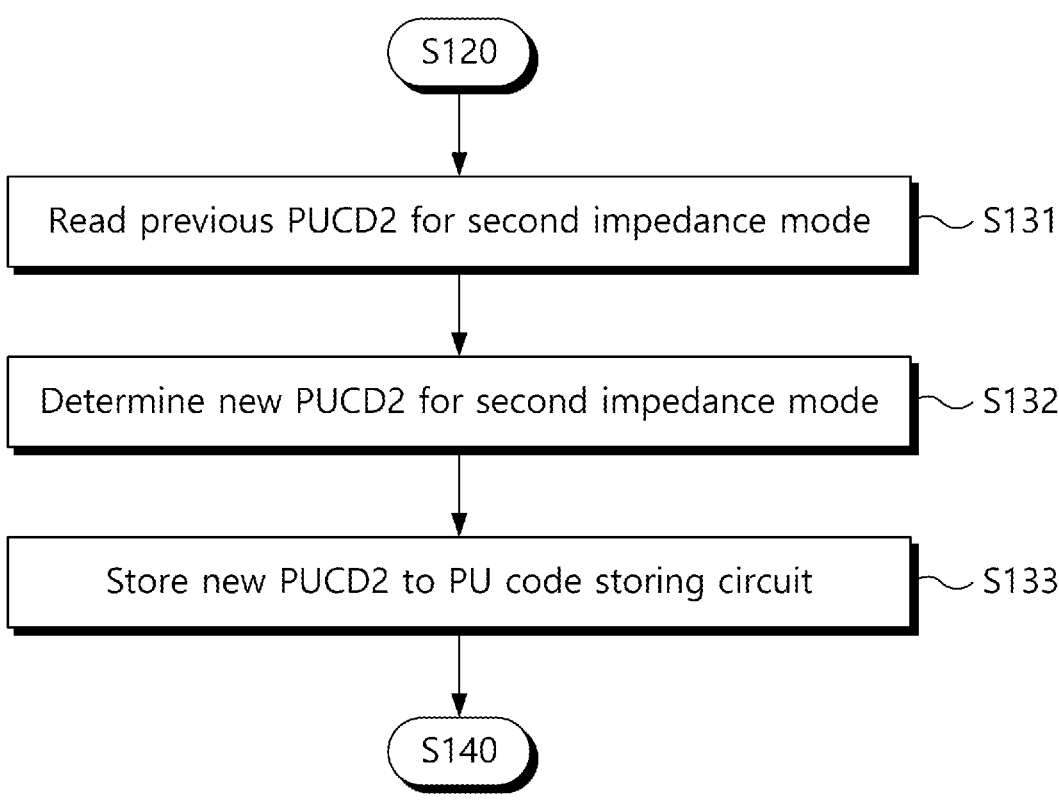
FIG. 8 is a flowchart illustrating a second sub-impedance calibration of FIG. 5.
Figure 9:
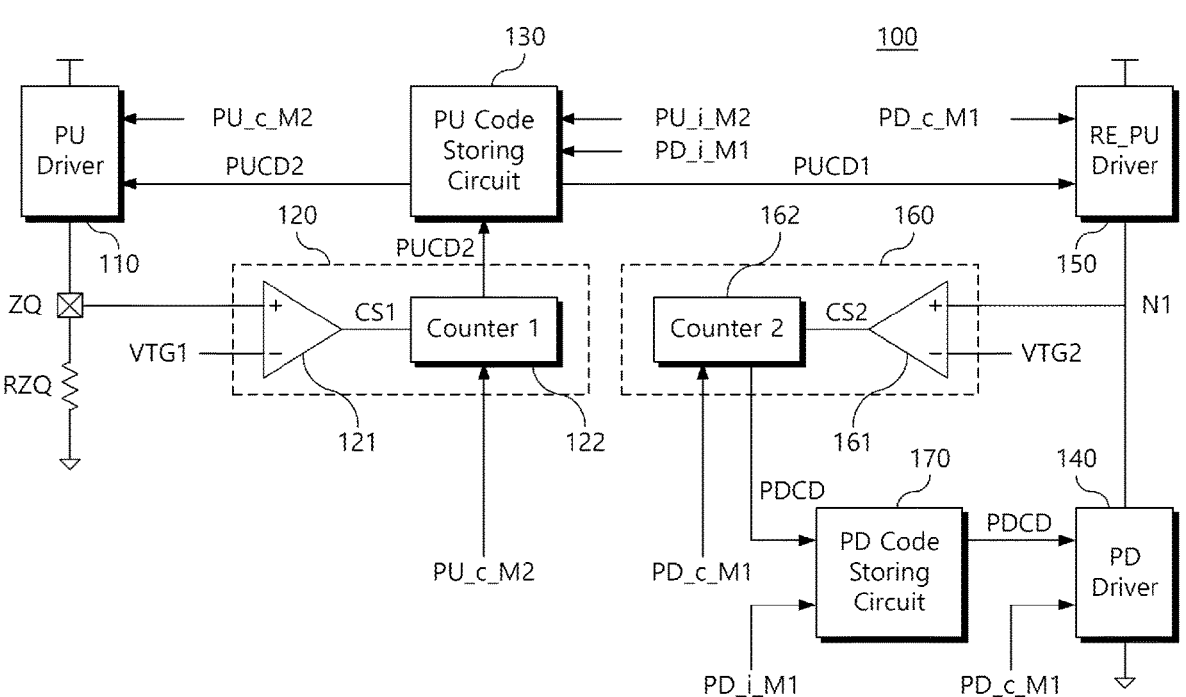
FIG. 9 is a diagram illustrating an impedance calibration circuit during the second sub-impedance calibration and a third sub-impedance calibration of FIG. 5.

FIG. 8 is a flowchart illustrating a second sub-impedance calibration of FIG. 5. FIG. 9 is a diagram illustrating an impedance calibration circuit during the second sub-impedance calibration and a third sub-impedance calibration of FIG. 5. Referring to FIGS. 8 and 9, the second sub-impedance calibration CAL2 may be performed in a portion or part (e.g., a first part) of the impedance calibration circuit 100. For example, the second sub-impedance calibration CAL2 may be performed through the pull-up driver 110, the first code generator 120 and the pull-up code storing circuit 130. During the second sub-impedance calibration CAL2, the impedance calibration circuit 100 may newly acquire the second pull-up impedance calibration code PUCD2 of the pull-up driver 110 operating in the second impedance mode M2.

According to an example embodiment, in operation S131, the impedance calibration circuit 100 may read a previous second pull-up impedance calibration code PUCD2. For example, the pull-up code storing circuit 130 may receive the second pull-up initial signal PU_i_M2. The pull-up code storing circuit 130 may transmit the previously stored second pull-up impedance calibration code PUCD2 to the pull-up driver 110 based on the second pull-up initial signal PU_i_M2. The pull-up driver 110 may be driven based on the previous second pull-up impedance calibration code PUCD2.

According to an example embodiment, in operation S132, the impedance calibration circuit 100 may determine a new second pull-up impedance calibration code PUCD2. For example, the pull-up driver 110 and the first code generator 120 may receive the second pull-up control signal PU_c_M2. The pull-up driver 110 and the first code generator 120 may perform the second sub-impedance calibration CAL2 based on the second pull-up control signal PU_c_M2. For example, the second sub-impedance calibration CAL2 may be performed until a transition of the first comparison signal CS1 occurs by comparing the voltage of the ZQ pad ZQ with the first target voltage VTG1. When the transition of the first comparison signal CS1 occurs by comparing the voltage of the ZQ pad ZQ with the first target voltage VTG1, the first counter 122 may determine the new second pull-up impedance calibration code PUCD2. As another example, the second sub-impedance calibration CAL2 may be performed for a specified time. The first counter 122 may determine the new second pull-up impedance calibration code PUCD2 when the specified time elapses.

According to an example embodiment, in operation S133, the impedance calibration circuit 100 may store (or update) the new second pull-up impedance calibration code PUCD2. For example, when the new second pull-up impedance calibration code PUCD2 is determined, the first counter 122 may transmit the new second pull-up impedance calibration code PUCD2 to the pull-up code storing circuit 130. The pull-up code storing circuit 130 may store (or update) the new second pull-up impedance calibration code PUCD2. The pull-up code storing circuit 130 may store the first pull-up impedance calibration code PUCD1 and the second pull-up impedance calibration code PUCD2.

Figure 10:
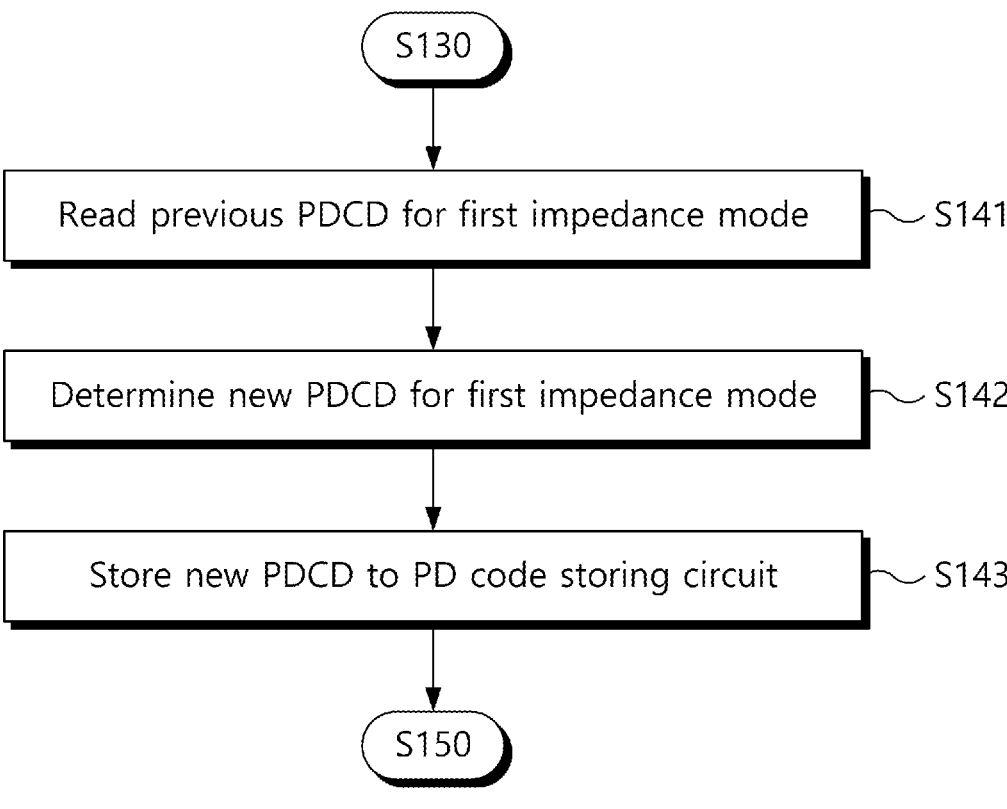
FIG. 10 is a flowchart illustrating a third sub-impedance calibration of FIG. 5.

FIG. 10 is a flowchart illustrating a third sub-impedance calibration of FIG. 5. Referring to FIGS. 9 and 10, the third sub-impedance calibration CAL3 may be performed in a portion or part (e.g., a second part) of the impedance calibration circuit 100. For example, the third sub-impedance calibration CAL3 may be performed through the pull-down driver 140, the replica pull-up driver 150, the second code generator 160, and the pull-down code storing circuit 170. Accordingly, the third sub-impedance calibration CAL3 may be performed simultaneously with the second sub-impedance calibration CAL2. During the third sub-impedance calibration CAL3, the impedance calibration circuit 100 may newly acquire the pull-down impedance calibration code PDCD of the pull-down driver 140 operating in the first impedance mode M1.

According to an example embodiment, in operation S141, the impedance calibration circuit 100 may read the previous pull-down impedance calibration code PDCD. For example, the pull-down code storing circuit 170 may receive the pull-down initial signal PD_i_M1. The pull-down code storing circuit 170 may transmit the previously stored pull-down impedance calibration code PDCD to the pull-down driver 140 based on the pull-down initial signal PD_i_M1. The pull-down driver 140 may be driven based on the previously stored pull-down impedance calibration code PDCD. In addition, the pull-up code storing circuit 130 may receive the pull-down initial signal PD_i_M1. The pull-up code storing circuit 130 may transmit the first pull-up impedance calibration code PUCD1 updated in FIGS. 6 and 7 to the replica pull-up driver 150 based on the pull-down initial signal PD_i_M1. The replica pull-up driver 150 may be driven based on the updated first pull-up impedance calibration code PUCD1.

According to an example embodiment, in operation S142, the impedance calibration circuit 100 may determine a new pull-down impedance calibration code PDCD. For example, the pull-down driver 140, the replica pull-up driver 150, and the second code generator 160 may perform the third sub-impedance calibration CAL3 based on the pull-down control signal PD_c_M1. As an example, the voltage of the first node N1 may be determined by driving the pull-down driver 140 and the replica pull-up driver 150. The third sub-impedance calibration CAL3 may be performed until a transition of the second comparison signal CS2 occurs by comparing the voltage of the first node N1 with the second target voltage VTG2. When the transition occurs in the second comparison signal CS2 by comparing the voltage of the first node N1 with the second target voltage VTG2, the second counter 162 may determine the new pull-down impedance calibration code PDCD. As another example, the third sub-impedance calibration CAL3 may be performed for a specified time. The second counter 162 may determine the new pull-down impedance calibration code PDCD when the specified time elapses.

According to an example embodiment, in operation S143, the impedance calibration circuit 100 may store (or update) the new pull-down impedance calibration code PDCD. For example, when the new pull-down impedance calibration code PDCD is determined, the second counter 162 may transmit the new pull-down impedance calibration code PDCD to the pull-down code storing circuit 170. The pull-down code storing circuit 170 may store (or update) the new pull-down impedance calibration code PDCD. The pull-down code storing circuit 170 may store the new pull-down impedance calibration code PDCD.

According to an example embodiment, components used in the second sub-impedance calibration CAL2 of FIG. 8 may be different from components used in the third sub-impedance calibration CAL3. For example, the second sub-impedance calibration CAL2 may be performed through the pull-up driver 110, the first code generator 120 and the pull-up code storing circuit 130. The third sub-impedance calibration CAL3 may be performed through the pull-down driver 140, the replica pull-up driver 150, the second code generator 160, and the pull-down code storing circuit 170. The pull-up code storing circuit 130 may transmit the updated first pull-up impedance calibration code PUCD1 to the replica pull-up driver 150 based on the pull-down initial signal PD_i_M1. Accordingly, the third sub-impedance calibration CAL3 may be performed simultaneously with the second sub-impedance calibration CAL2.

Figure 11:
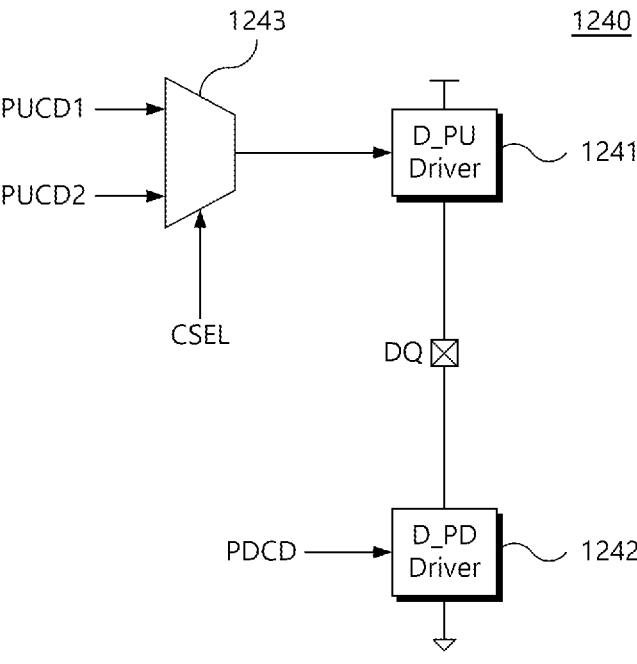
FIG. 11 is a diagram illustrating a input-output circuit of FIG. 2.

FIG. 11 is a diagram illustrating an input-output circuit of FIG. 2. Referring to FIGS. 3 and 11, the input/output circuit 1240 may include a data pull-up driver 1241, a data pull-down driver 1242, and an impedance calibration code selection circuit 1243. The data pull-up driver 1241 may have substantially the same configuration as the pull-up driver 110 of FIG. 3. The data pull-down driver 1242 may have substantially the same configuration as the pull-down driver 140 of FIG. 3. The input/output circuit 1240 may use various impedance calibration codes based on impedance modes.

According to an example embodiment, both the data pull-up driver 1241 and the data pull-down driver 1242 may be driven in the first impedance mode M1 (for example, a read operation, a RON mode). For example, the impedance calibration code selection circuit 1243 may transmit the first pull-up impedance calibration code PUCD1 to the data pull-up driver 1241 based on the code selection signal CSEL. The data pull-down driver 1242 may receive a pull-down impedance calibration code PDCD.

According to an example embodiment, in the second impedance mode M2 (for example, a non-target read operation, a write operation, a RTT mode), only the data pull-up driver 1241 is driven, and the data pull-down driver 1242 is disabled. For example, the impedance calibration code selection circuit 1243 may transmit the second pull-up impedance calibration code PUCD2 to the data pull-up driver 1241 based on the code selection signal CSEL.

Figure 12:
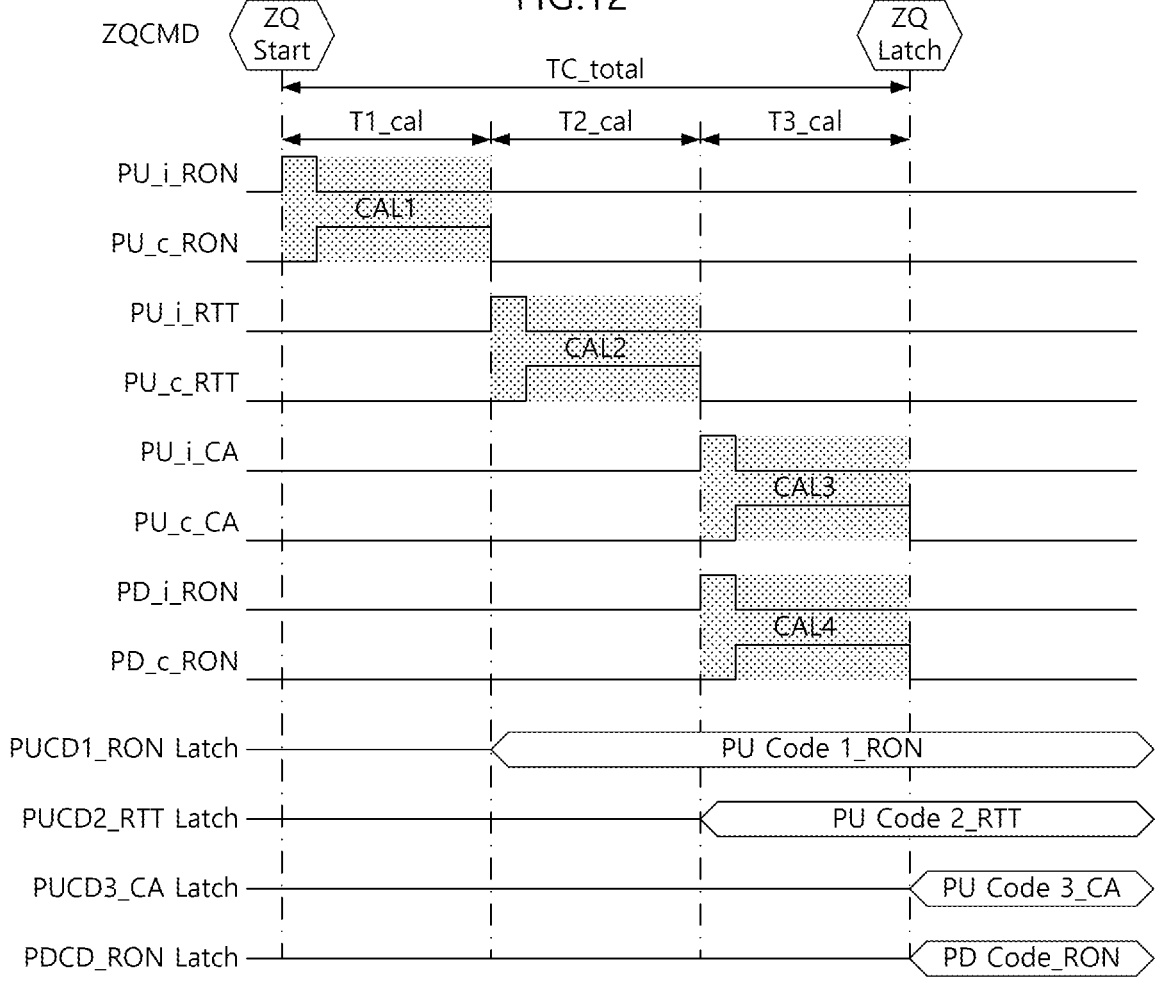
FIG. 12 is a timing diagram illustrating another example of a multi-step impedance calibration method of the impedance calibration circuit of FIG. 3.

FIG. 12 is a timing diagram illustrating another example of a multi-step impedance calibration method of the impedance calibration circuit of FIG. 3. Referring to FIGS. 3 and 12, the impedance calibration circuit 100 may perform a plurality of sub-impedance calibrations by dividing the total impedance calibration section TC_total into a plurality of sub-impedance calibration sections. In other words, the impedance calibration circuit 100 may divide the total impedance calibration section TC_total into a plurality of sub-impedance calibration sections (e.g., T1_cal T2_cal, and T3_cal). For example, the impedance calibration circuit 100 may receive the impedance calibration command ZQCMD. The impedance calibration command ZQCMD may include a start command ZQ Start and a latch command ZQ Latch. The total impedance calibration section TC_total may include a first impedance calibration section T1_cal, a second impedance calibration section T2_cal, and a third impedance calibration section T3_cal.

According to an example embodiment, the impedance calibration circuit 100 may perform a first sub-impedance calibration CAL1 in the first impedance calibration section T1_cal. The first sub-impedance calibration CAL1 may generate a first pull-up impedance calibration code PUCD1 corresponding to an impedance RON for a read operation (hereinafter read impedance RON). For example, the first sub-impedance calibration CAL1 and the first pull-up impedance calibration code PUCD1 may correspond to a read impedance mode (i.e., RON mode). The impedance calibration circuit 100 may perform a second sub-impedance calibration CAL2 in the second impedance calibration section T2_cal. The second sub-impedance calibration CAL2 may generate a second pull-up impedance calibration code PUCD2 corresponding to an impedance RTT (hereinafter referred to as a non-target impedance RTT) for a non-target read or write operation. For example, the second sub-impedance calibration CAL2 and the second pull-up impedance calibration code PUCD2 may correspond a non-target impedance mode (i.e., RTT mode). The impedance calibration circuit 100 may perform a third sub-impedance calibration CAL3 and a fourth sub-impedance calibration CAL4 in the third impedance calibration section T3_cal. The third sub-impedance calibration CAL3 may generate a third pull-up impedance calibration code PUCD3 corresponding to an impedance CA (hereinafter referred to as a command impedance CA) for an operation receiving command. For example, the third sub impedance calibration CAL3 and the third pull-up impedance calibration code PUCD3 may correspond to a command impedance mode (i.e., CA mode). The fourth sub-impedance calibration CAL4 may generate a pull-down impedance calibration code PDCD corresponding to the read impedance RON. For example, the fourth sub-impedance calibration CAL4 and the pull-down impedance calibration code PDCD may correspond to the read impedance mode (i.e., RON mode).

According to an example embodiment, the multi-step calibration control circuit 101 may receive the start command ZQ Start and may generate impedance control signals corresponding to sub-impedance calibrations. For example, the multi-step calibration control circuit 101 may generate a read impedance pull-up initial signal PU_i_RON and a read impedance pull-up control signal PU_c_RON corresponding to the first sub-impedance calibration CAL1. The multi-step calibration control circuit 101 may generate a non-target impedance pull-up initial signal PU_i_RTT and a non-target impedance pull-up control signal PU_c_RTT corresponding to the second sub-impedance calibration CAL2. The multi-step calibration control circuit 101 may generate a command impedance pull-up initial signal PU_i_CA and a command impedance pull-up control signal PU_c_CA corresponding to the third sub-impedance calibration CAL3. The multi-step calibration control circuit 101 may generate a read impedance pull-down initial signal PD_i_RON and a read impedance pull-down control signal PD_c_RON corresponding to the fourth sub-impedance calibration CAL4.

According to an example embodiment, the multi-step calibration control circuit 101 may generate the read impedance pull-up initial signal PU_i_RON and the read impedance pull-up control signal PU_c_RON in the first impedance calibration section T1_cal. The multi-step calibration control circuit 101 may generate the non-target impedance pull-up initial signal PU_i_RTT and the non-target impedance pull-up control signal PU_c_RTT in the second impedance calibration section T2_cal. The multi-step calibration control circuit 101 may generate the command impedance pull-up initial signal PU_i_CA, the command impedance pull-up control signal PU_c_CA, the read impedance pull-down initial signal PD_i_RON, and the read impedance pull-down control signal PD_c_RON in the third impedance calibration section T3_cal.

According to an example embodiment, the first pull-up impedance calibration code PUCD1 is generated by the pull-up driver 110, the first code generator 120, and the pull-up code storing circuit 130 based on the read impedance pull-up initial signal PU_i_RON and the read impedance pull-up control signal PU_c_RON. The second pull-up impedance calibration code PUCD2 is generated by the pull-up driver 110, the first code generator 120 and the pull-up code storing circuit 130 based on the non-target impedance pull-up initial signal PU_i_RTT and the non-target impedance pull-up control signal PU_c_RTT. The third pull-up impedance calibration code PUCD3 is generated by the pull-up driver 110, the first code generator 120, and the pull-up code storing circuit 130 based on the command impedance pull-up initial signal PU_i_CA and the command impedance pull-up control signal PU_c_CA. The pull-down impedance calibration code PDCD is generated by the pull-down driver 140, the replica pull-up driver 150, the second code generator 160, and the pull-down code storing circuit 170 based on the read impedance pull-down initial signal PD_i_RON and the read impedance pull-down control signal PD_c_RON.

Accordingly, the impedance calibration circuit 100 may perform at least one of the first, second, third, or fourth sub-impedance calibrations CAL1, CAL2, CAL3, or CAL4 in each of the first, second, and third impedance calibration sections T1_cal, T2_cal, and T3_cal. The first, second, third, and fourth sub-impedance calibrations CAL1, CAL2, CAL3, and CAL4 may respectively correspond to at least one of the read impedance mode (i.e., RON mode), the non-target impedance mode (i.e., RTT mode), or the command impedance mode (i.e., CA mode). For example, the first sub-impedance calibration CAL1 may correspond to the read impedance mode (i.e., RON mode), the second sub-impedance calibration CAL2 may correspond to the non-target impedance mode (i.e., RTT mode), the third sub-impedance calibration CAL3 may correspond to the command impedance mode (i.e., CA mode), and the fourth sub-impedance calibration CAL4 may correspond to the read impedance mode (i.e., RON mode).

Figure 13:
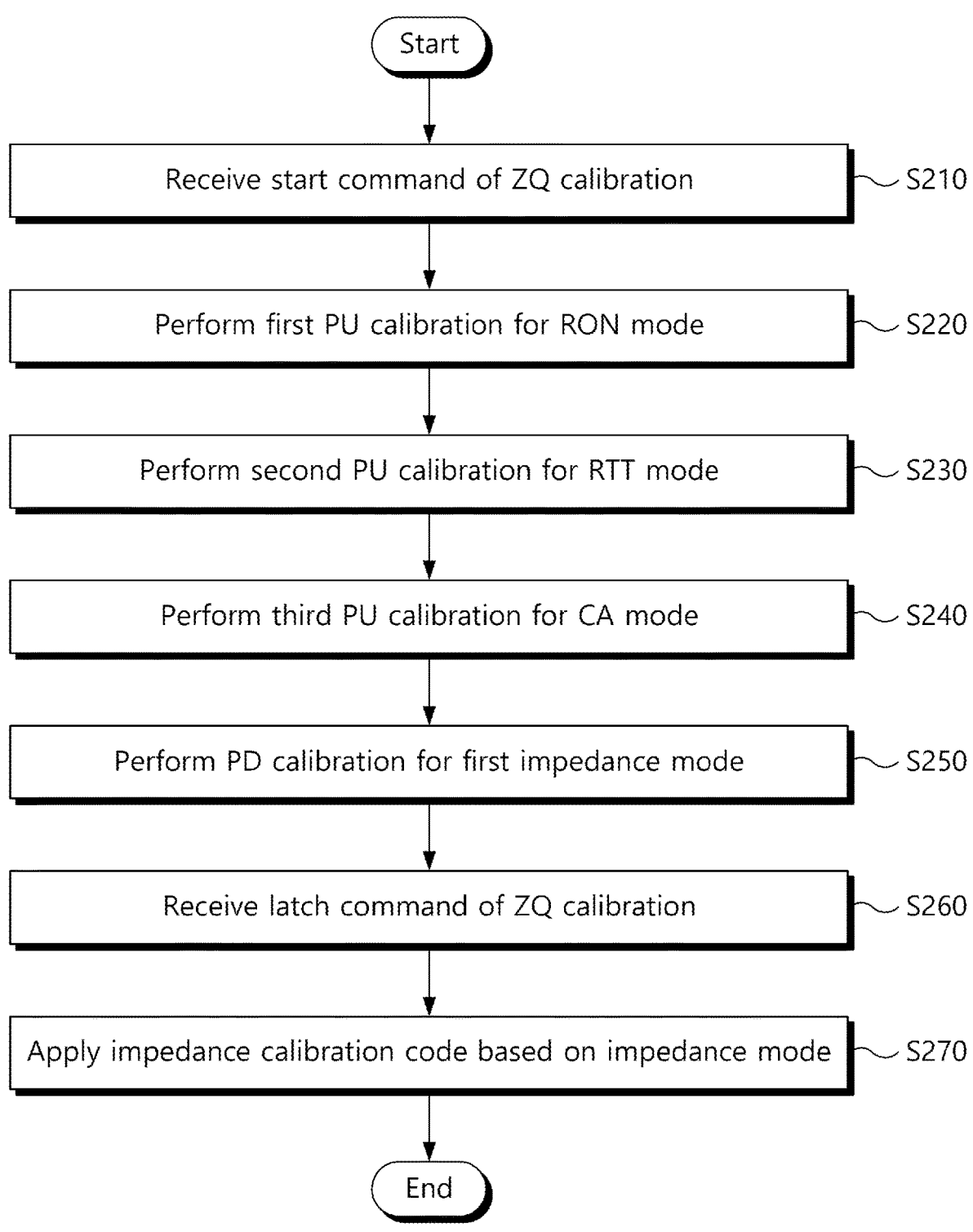
FIG. 13 is a flowchart illustrating another example of a multi-step impedance calibration method of the impedance calibration circuit of FIG. 3.
Figure 14:
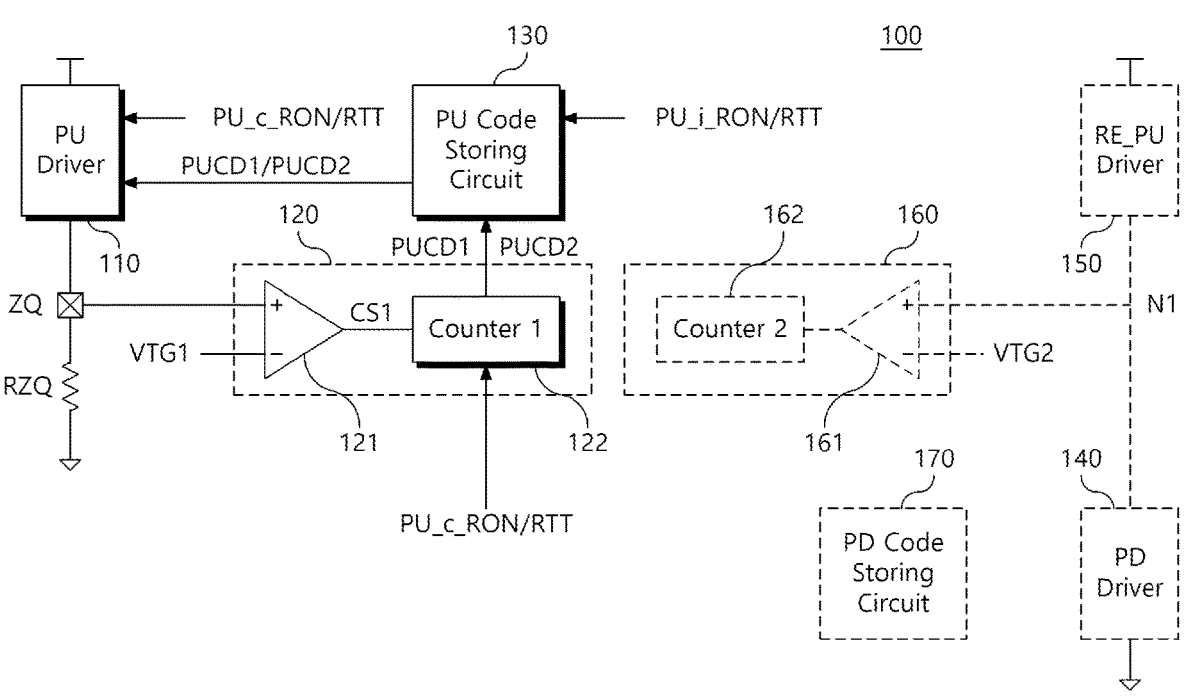
FIG. 14 is a diagram illustrating an impedance calibration circuit during the first sub-impedance calibration and the second sub-impedance calibration of FIG. 13.
Figure 15:
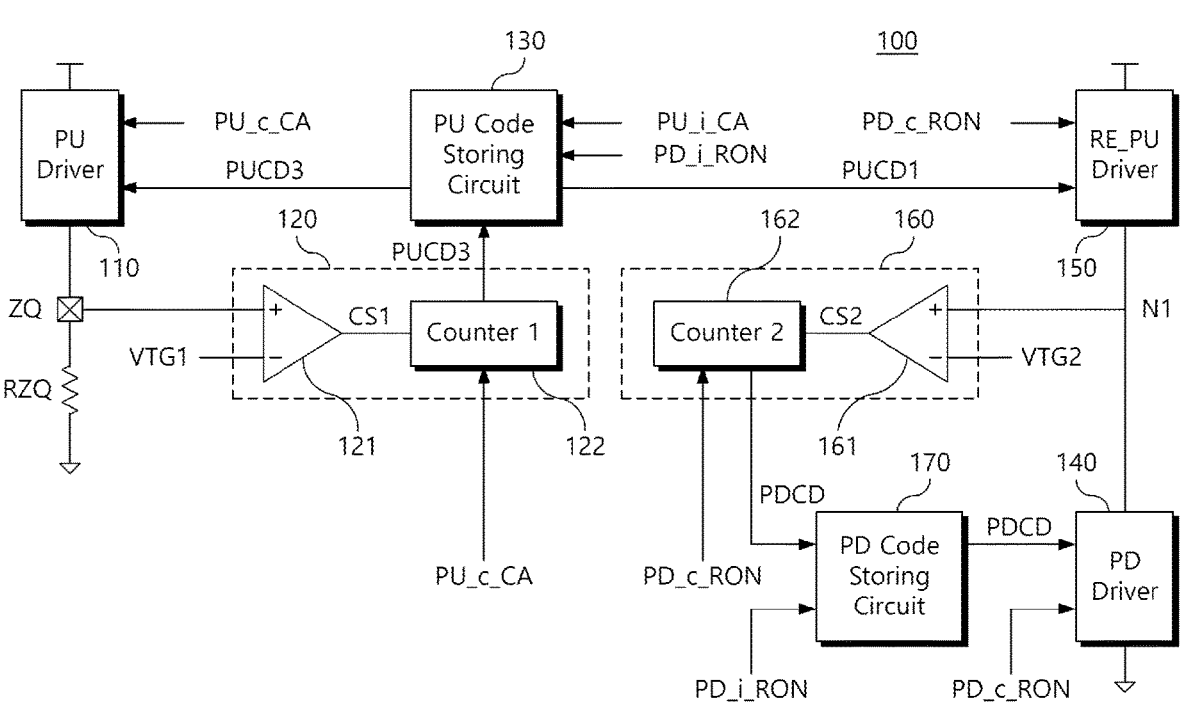
FIG. 15 is a diagram illustrating an impedance calibration circuit during the third sub-impedance calibration and the fourth sub-impedance calibration of FIG. 13.

FIG. 13 is a flowchart illustrating another example of a multi-step impedance calibration method of the impedance calibration circuit of FIG. 3. FIG. 14 is a diagram illustrating an impedance calibration circuit during the first sub-impedance calibration and the second sub-impedance calibration of FIG. 13. FIG. 15 is a diagram illustrating an impedance calibration circuit during the third sub-impedance calibration and the fourth sub-impedance calibration of FIG. 13. Referring to FIGS. 12 to 14, the impedance calibration circuit 100 may generate a plurality of impedance calibration codes by performing a plurality of sub-impedance calibrations within the total impedance calibration section TC_total.

According to an example embodiment, in operation S210, the impedance calibration circuit 100 may receive a start command ZQ Start among the impedance calibration commands ZQCMD. For example, the start command ZQ Start may be transmitted from the control logic 1250 of FIG. 2 (or the memory controller 1100 of FIG. 1). The total impedance calibration section TC_total may be started by the start command ZQ Start.

According to an example embodiment, in operation S220, the impedance calibration circuit 100 may perform the first sub-impedance calibration CAL1 corresponding to the read impedance mode (RON mode). During the first sub-impedance calibration CAL1, the impedance calibration circuit 100 may perform an impedance calibration of the pull-up driver 110 corresponding to the read impedance mode (RON mode). For example, in the first impedance calibration section T1_cal, the multi-step calibration control circuit 101 (see FIG. 3) may generate the read impedance pull-up initial signal PU_i_RON and the read impedance pull-up control signal PU_c_RON. Based on the read impedance pull-up initial signal PU_i_RON, the pull-up code storing circuit 130 may transmit a previously stored first pull-up impedance calibration code PUCD1 to the pull-up driver 110. The pull-up driver 110 may be driven based on the previous first pull-up impedance calibration code PUCD1. After that, based on the read impedance pull-up control signal PU_c_RON, the pull-up driver 110 and the first code generator 120 may perform the first sub-impedance calibration CAL1. When the first sub-impedance calibration CAL1 is completed, after the first impedance calibration section T1_cal, the first code generator 120 may store (or update) a new first pull-up impedance calibration code PUCD1 in the pull-up code storing circuit 130.

According to an example embodiment, in operation S230, the impedance calibration circuit 100 may perform the second sub-impedance calibration CAL2 corresponding to the non-target impedance mode (RTT mode). During the second sub-impedance calibration CAL2, the impedance calibration circuit 100 may perform an impedance calibration of the pull-up driver 110 corresponding to the non-target impedance mode (RTT mode). For example, in the second impedance calibration section T2_cal, the multi-step calibration control circuit 101 (see FIG. 3) may generate the non-target impedance pull-up initial signal PU_i_RTT and the non-target impedance pull-up control signal PU_c_RTT. Based on the non-target impedance pull-up initial signal PU_i_RTT, the pull-up code storing circuit 130 may transmit a previously stored second pull-up impedance calibration code PUCD2 to the pull-up driver 110. The pull-up driver 110 may be driven based on the previous second pull-up impedance calibration code PUCD2. After that, based on the non-target impedance pull-up control signal PU_c_RTT, the pull-up driver 110 and the first code generator 120 may perform the second sub-impedance calibration CAL2. When the second sub-impedance calibration CAL2 is completed, after the second impedance calibration section T2_cal, the first code generator 120 may store (or update) a new second pull-up impedance calibration code PUCD2 in the pull-up code storing circuit 130.

As an example, referring to FIG. 14, during the first sub-impedance calibration CAL1 or the second sub-impedance calibration CAL2, the impedance calibration circuit 100 may only partially operate. The first sub-impedance calibration CAL1 or the second sub-impedance calibration CAL2 may be performed through the pull-up driver 110, the first code generator 120, and the pull-up code storing circuit 130. At this time, the pull-down driver 140, the replica pull-up driver 150, the second code generator 160, and the pull-down code storing circuit 170 may be deactivated.

Referring to FIGS. 12, 13, and 15, according to an example embodiment, in operation S240, the impedance calibration circuit 100 may perform the third sub impedance calibration CAL3 corresponding to the command impedance mode (CA mode). During the third sub-impedance calibration CAL3, the impedance calibration circuit 100 may perform an impedance calibration of the pull-up driver 110 corresponding to the command impedance mode (CA mode). For example, in the third impedance calibration section T3_cal, the multi-step calibration control circuit 101 (see FIG. 3) may generate the command impedance pull-up initial signal PU_i_CA and the command impedance pull-up control signal PU_c_CA. Based on the command impedance pull-up initial signal PU_i_CA, the pull-up code storing circuit 130 may transmit a previously stored third pull-up impedance calibration code PUCD3 to the pull-up driver 110. The pull-up driver 110 may be driven based on the previous third pull-up impedance calibration code PUCD3. After that, based on the command impedance pull-up control signal PU_c_CA, the pull-up driver 110 and the first code generator 120 may perform the third sub-impedance calibration CAL3. When the third sub-impedance calibration CAL3 is completed, after the third impedance calibration section T3_cal, the first code generator 120 may store (or update) a new third pull-up impedance calibration code PUCD3 in the pull-up code storing circuit 130.

According to an example embodiment, in operation S250, the impedance calibration circuit 100 may perform the fourth sub-impedance calibration CAL4 corresponding to the read impedance mode (RON mode). During the fourth sub-impedance calibration CAL4, the impedance calibration circuit 100 may perform the impedance calibration of the pull-down driver 140 in the read impedance mode (RON mode). For example, in the third impedance calibration section T3_cal, the multi-step calibration control circuit 101 (see FIG. 3) may generate the read impedance pull-down initial signal PD_i_RON and the read impedance pull-down control signal PD_c_RON. Based on the read impedance pull-down initial signal PD_i_RON, the pull-down code storing circuit 170 may transmit a previously stored pull-down impedance calibration code PDCD to the pull-down driver 140. The pull-down driver 140 may be driven based on the previous pull-down impedance calibration code PDCD. In addition, based on the read impedance pull-down initial signal PD_i_RON, the pull-up code storing circuit 130 may transmit the updated first pull-up impedance calibration code PUCD1 in the first sub-impedance calibration CAL1 to the replica pull-up driver 150. The replica pull-up driver 150 may be driven based on the first pull-up impedance calibration code PUCD1. After that, based on the read impedance pull-down control signal PD_c_RON, the pull-down driver 140, the replica pull-up driver 150, and the second code generator 160 may perform the fourth sub-impedance calibration CAL4. When the fourth sub-impedance calibration CAL4 is completed, after the third impedance calibration section T3_cal, the second code generator 160 may store (or update) a new pull-down impedance calibration code PDCD in the pull-down code storing circuit 170.

As an example, referring to FIG. 15, the fourth sub-impedance calibration CAL4 may be performed simultaneously with the third sub-impedance calibration CAL3 (for example, in the third impedance calibration section T3_cal). The third sub-impedance calibration CAL3 may be performed through the pull-up driver 110, the first code generator 120 and the pull-up code storing circuit 130. The fourth sub-impedance calibration CAL4 may be performed through the pull-down driver 140, the replica pull-up driver 150, the second code generator 160, and the pull-down code storing circuit 170. The pull-up code storing circuit 130 may transmit the updated first pull-up impedance calibration code PUCD1 to the replica pull-up driver 150 based on the read impedance pull-down initial signal PD_i_RON.

According to an example embodiment, referring to FIGS. 12 to 15, in operation S260, the impedance calibration circuit 100 may receive the latch command ZQ Latch among the impedance calibration commands ZQCMD. For example, the latch command ZQ Latch may be transmitted from the control logic 1250 of FIG. 2 (or the memory controller 1100 of FIG. 1). The total impedance calibration section TC_total may be terminated by the latch command ZQ Latch.

According to an example embodiment, in operation S270, the impedance calibration circuit 100 may apply an impedance calibration code to the input/output circuit 1240 of FIG. 2 based on the impedance modes. For example, the input/output circuit 1240 of FIG. 2 may include the data pull-up driver 1241 (see FIG. 11) having substantially the same configuration as the pull-up driver 110 or a pull-up driver connected to the command pad CPAD (see FIG. 1). The input/output circuit 1240 of FIG. 2 may include the data pull-down driver 1242 (see FIG. 11) having substantially the same configuration as the pull-down driver 140. The impedance calibration circuit 100 may apply an impedance calibration code corresponding to an operation mode (for example, a read operation, a non-target read operation, a write operation, a command reception operation, or the like) of the memory device 1200 to the data pull-up driver 1241, the data pull-down driver 1242, or a pull-up driver connected to the command pad CPAD of the input/output circuit 1240.

Figure 16:
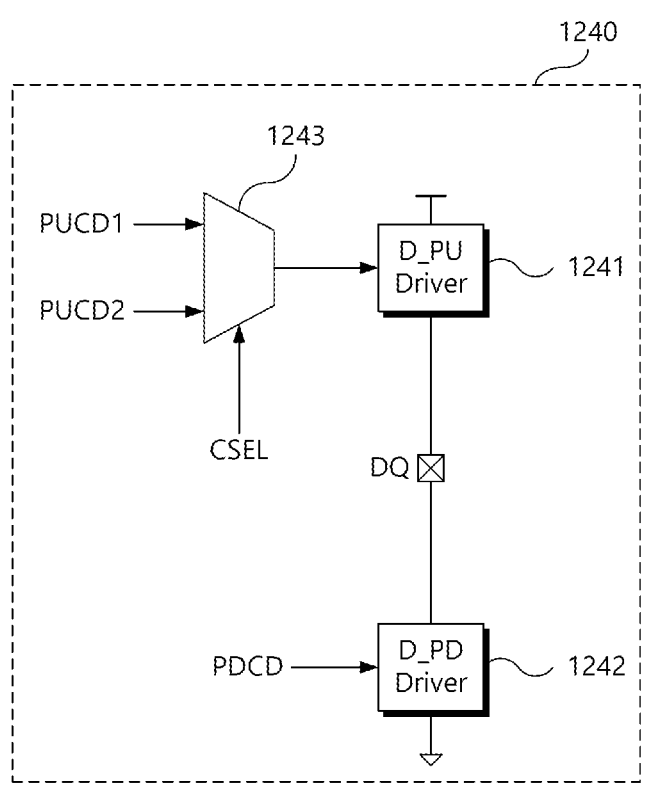
FIG. 16 is a diagram illustrating a pull-up driver connected to the input-output circuit and a command pad of FIG. 2.
Figure 16:
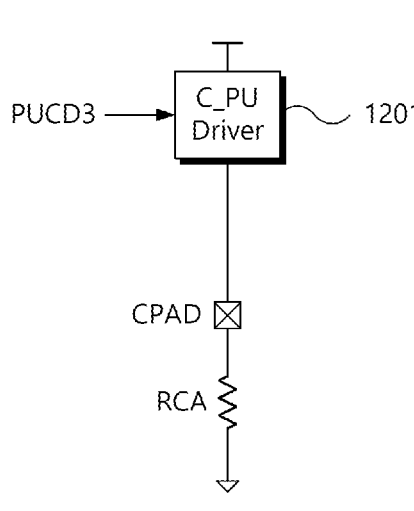

FIG. 16 is a diagram illustrating a pull-up driver connected to the input-output circuit and a command pad of FIG. 2. Referring to FIGS. 3 and 16, the input/output circuit 1240 may include a data pull-up driver 1241, a data pull-down driver 1242, and an impedance calibration code selection circuit 1243. The data pull-up driver 1241 and a command pull-up driver 1201 may have substantially the same configuration as the pull-up driver 110 of FIG. 3. The data pull-down driver 1242 may have substantially the same configuration as the pull-down driver 140 of FIG. 3. The input/output circuit 1240 and the command pull-up driver 1201 may use various impedance calibration codes based on an impedance mode(s).

According to an example embodiment, in the read impedance mode (RON mode), both the data pull-up driver 1241 and the data pull-down driver 1242 may be driven. For example, the impedance calibration code selection circuit 1243 may transmit the first pull-up impedance calibration code PUCD1 to the data pull-up driver 1241 based on a code selection signal CSEL. The data pull-down driver 1242 may receive the pull-down impedance calibration code PDCD.

According to an example embodiment, in the non-target impedance mode (RTT mode), only the data pull-up driver 1241 is driven, and the data pull-down driver 1242 may be deactivated. For example, the impedance calibration code selection circuit 1243 may transmit the second pull-up impedance calibration code PUCD2 to the data pull-up driver 1241 based on the code selection signal CSEL.

According to an example embodiment, in the command impedance mode (CA mode), the command pull-up calibration 1201 may receive the third pull-up impedance calibration code PUCD3. The command pull-up driver 1201 may be driven based on the third pull-up impedance calibration code PUCD3.

According to the present disclosure, it is possible to prevent or mitigate a change in termination impedance due to a change in impedance mode by generating various impedance calibration codes for each impedance mode.

While the present disclosure has been described with reference to embodiments thereof, it will be apparent to those of ordinary skill in the art that various changes and modifications may be made thereto without departing from the scope of the present disclosure as set forth in the following claims.

What is claimed is:

1. A memory device comprising:

a memory cell array that includes a plurality of memory cells;

an input/output circuit configured to transmit data received from an external source through a data pad to the memory cell array or transmit data read from the memory cell array to the external source; and an impedance calibration circuit configured to generate an impedance calibration code that is applied to the input/output circuit, wherein the impedance calibration circuit is further configured to:

perform a first sub-impedance calibration corresponding to a first impedance mode in a first sub-impedance calibration section, wherein the first impedance mode corresponds to a read operation;

in response to detecting a change from the first impedance mode to a second impedance mode, perform a second sub-impedance calibration corresponding to the second impedance mode in a second sub-impedance calibration section, wherein the second impedance mode corresponds to a write operation.

2. The memory device of claim 1, wherein the impedance calibration circuit is further configured to:

generate a first impedance calibration code corresponding to the first impedance mode in the first sub-impedance calibration section; and generate a second impedance calibration code corresponding to the second impedance mode in the second sub-impedance calibration section.

3. The memory device of claim 2, wherein the impedance calibration circuit is configured to generate a third impedance calibration code corresponding to the first impedance mode in the second sub-impedance calibration section.

4. The memory device of claim 3, wherein the first impedance calibration code and the second impedance calibration code are used in a pull-up driver of the input/output circuit, and the third impedance calibration code is used in a pull-down driver of the input/output circuit.

5. The memory device of claim 3, wherein the impedance calibration circuit comprises:

a first part including a pull-up driver; and a second part including a pull-down driver, and wherein the first part is configured to generate the first impedance calibration code and the second impedance calibration code, and the second part is configured to generate the third impedance calibration code.

6. The memory device of claim 5, wherein the impedance calibration circuit is configured to generate the first impedance calibration code in the first sub-impedance calibration section by activating the first part and inactivating the second part.

7. The memory device of claim 5, wherein, in the second sub-impedance calibration section, the impedance calibration circuit is configured to:

generate the second impedance calibration code through the first part; and generate the third impedance calibration code through the second part.

8. A memory device comprising:

a memory cell array including a plurality of memory cells;

an input/output circuit configured to transmit data received from an outside through a data pad to the memory cell array or transmit data read from the memory cell array to the outside; and an impedance calibration circuit configured to generate an impedance calibration code applied to the input/output circuit, wherein the impedance calibration circuit is configured to:

perform a first sub-impedance calibration corresponding to a first impedance mode in a first sub-impedance calibration section, wherein the first impedance mode corresponds to a read operation; and in response to detecting a change from the first impedance mode to a second impedance mode, perform a second sub-impedance calibration corresponding to the second impedance mode in a second sub-impedance calibration section, wherein the second impedance mode corresponds to a non-target read operation.

9. The memory device of claim 8, wherein the impedance calibration circuit is further configured to:

generate a first impedance calibration code corresponding to the first impedance mode in the first sub-impedance calibration section, and generate a second impedance calibration code corresponding to the second impedance mode in the second sub-impedance calibration section.

10. The memory device of claim 9, wherein the impedance calibration circuit is configured to generate a third impedance calibration code corresponding to the first impedance mode in the second sub-impedance calibration section.

11. The memory device of claim 10, wherein the first impedance calibration code and the second impedance calibration code are used in a pull-up driver of the input/output circuit, and the third impedance calibration code is used in a pull-down driver of the input/output circuit.

12. The memory device of claim 10, wherein the impedance calibration circuit includes:

a first part including a pull-up driver; and a second part including a pull-down driver, wherein the first part generates the first impedance calibration code and the second impedance calibration code, and the second part generates the third impedance calibration code.

13. The memory device of claim 12, wherein the impedance calibration circuit is configured to generate the first impedance calibration code in the first sub-impedance calibration section by activating the first part and inactivating the second part.

14. The memory device of claim 12, wherein, in the second sub-impedance section, the impedance calibration circuit is configured to:

generate the second impedance calibration code through the first part, and generate the third impedance calibration code through the second part.

15. A memory device comprising:

a memory cell array including a plurality of memory cells;

an input/output circuit configured to transmit data received from an outside through a data pad to the memory cell array or transmit data read from the memory cell array to the outside; and an impedance calibration circuit configured to generate an impedance calibration code applied to the input/output circuit, wherein the impedance calibration circuit is configured to:

perform a first sub-impedance calibration corresponding to a first impedance mode in a first sub-impedance calibration section, wherein the first impedance mode corresponds to a write operation; and in response to detecting a change from the first impedance mode to a second impedance mode, perform a second sub-impedance calibration corresponding to the second impedance mode in a second sub-impedance calibration section, wherein the second impedance mode corresponds to a non-target read operation.

16. The memory device of claim 15, wherein the impedance calibration circuit is further configured to:

generate a first impedance calibration code corresponding to the first impedance mode in the first sub-impedance calibration section, and generate a second impedance calibration code corresponding to the second impedance mode in the second sub-impedance calibration section.

17. The memory device of claim 16, wherein the impedance calibration circuit is configured to generate a third impedance calibration code corresponding to the first impedance mode in the second sub-impedance calibration section.

18. The memory device of claim 17, wherein the first impedance calibration code and the second impedance calibration code are used in a pull-up driver of the input/output circuit, and the third impedance calibration code is used in a pull-down driver of the input/output circuit.

19. The memory device of claim 17, wherein the impedance calibration circuit includes:

a first part including a pull-up driver; and a second part including a pull-down driver, wherein the first part generates the first impedance calibration code and the second impedance calibration code, and the second part generates the third impedance calibration code.

20. The memory device of claim 19, wherein the impedance calibration circuit is configured to generate the first impedance calibration code in the first sub-impedance calibration section by activating the first part and inactivating the second part.

\* \* \* \* \*